US008686793B2

(12) United States Patent
Stochino et al.

(10) Patent No.: US 8,686,793 B2
(45) Date of Patent: Apr. 1, 2014

(54) AMPLIFIER DEVICE WITH REITERABLE ERROR CORRECTION SCHEME WITH BALANCED NEGATIVE FEEDBACK

(76) Inventors: Giovanni Stochino, Rome (IT); Adrio Pantaleoni, Rome (IT)

( * ) Notice: Subject to any disclaimer, the term of this patent is extended or adjusted under 35 U.S.C. 154(b) by 0 days.

(21) Appl. No.: 13/528,232

(22) Filed: Jun. 20, 2012

(65) Prior Publication Data

US 2012/0326790 A1    Dec. 27, 2012

(30) Foreign Application Priority Data

Jun. 21, 2011   (IT) .............................. RM2011A0321

(51) Int. Cl.
*H03F 1/26* (2006.01)

(52) U.S. Cl.
USPC ........................................................ 330/149

(58) Field of Classification Search
USPC .......................... 330/149; 375/297; 455/114.3
See application file for complete search history.

(56) References Cited

U.S. PATENT DOCUMENTS

| | | | |
|---|---|---|---|
| 1,686,792 A | 10/1928 | Black | |
| 2,748,201 A | 5/1956 | McMillan | |
| 3,624,532 A | 11/1971 | Seidel | |
| 4,243,943 A | 1/1981 | Cherry | |
| 4,276,514 A | 6/1981 | Huang | |
| 4,571,553 A | 2/1986 | Yokoyama | |
| 5,892,398 A | 4/1999 | Candy | |
| 6,275,102 B1 | 8/2001 | Muza | |
| 6,480,705 B1 * | 11/2002 | Kusunoki | 330/149 |
| 6,567,478 B2 * | 5/2003 | Oishi et al. | 375/297 |
| 6,600,367 B2 | 7/2003 | Candy | |
| 7,564,304 B2 | 7/2009 | Stochino et al. | |
| 7,680,468 B2 * | 3/2010 | Rabjohn et al. | 330/149 |
| 2002/0021171 A1 | 2/2002 | Candy | |
| 2008/0186097 A1 | 8/2008 | Stochino et al. | |
| 2008/0297427 A1 | 12/2008 | Jung et al. | |

FOREIGN PATENT DOCUMENTS

EP          1 913 687          4/2008

OTHER PUBLICATIONS

Edward M. Cherry, "A new result in negative feedback theory and its application to audio power amplifiers", International Journal of Circuit Theory and Applications, vol. 6, pp. 265-288, Jul. 1978, John Wiley & Sons Ltd., U.S.A.
Edward M. Cherry, "A Power Amplifier Improver"*J. Audio Eng. Soc.*, vol. 29, No. 3, pp. 140-147, Mar. 1981, U.S.A.
Edward M. Cherry, "Nested differentiating feedback loops in simple power amplifiers", *J. Audio Eng. Soc.*, vol. 30, pp. 295-305, May 1982, U.S.A.

(Continued)

*Primary Examiner* — Khanh V Nguyen
(74) *Attorney, Agent, or Firm* — Hershkovitz & Associates, PLLC; Abraham Hershkovitz

(57) ABSTRACT

A very low distortion amplifier using one or more error correction loops based on a balanced error negative feedback scheme intrinsically and easily reiterable. Such loops are applied to a generic amplifier block $A_1$ in order to reduce its error in a wide frequency band, without substantially interfering, in the correction process, with the main path of the useful signal $V_i$, to amplify, whereby the corrected amplifier preserves the same response, in time and frequency, the same dynamic behavior and the same stability margins in amplitude and phase, of the not corrected amplifier $A_1$. This result is obtained by means of a balance and reference block $A_2$, capable to decouple the error correction loop from the main path of the useful signal $V_i$, in a very wide frequency band.

30 Claims, 13 Drawing Sheets

(56) References Cited

OTHER PUBLICATIONS

J. R. MacDonald, "Active-Error Feedback and its Application to a Specific Driver Circuit", Proc. IRE, vol. 43, pp. 808-813, Jul. 1955, U.S.A.

P.L., "Un ingénieux dispositive réducteur de distorsion pour amplificateurs de puissances", revue du SON, N° 242, pp. 37-40, Jun. 1973, France.

Malcom J. Hawksford, "Distortion Correction in Audio Power Amplifiers", *J. Audio Eng. Society*, vol. 29, No. ½, Jan./Feb. 1981, U.S.A.

Robert R. Cordell, "A Mosfet Power Amplifier with Error Correction", J. Audio Eng. Soc., vol. 32, No. 1/2, Jan./Feb. 1984, U.S.A.

Malcom J. Hawksford, "Power amplifier output stage design incorporating error feedback correction with current damping enhancement", Presented at the 74$^{th}$ AES Convention, 1983, Oct. 8-12, New York, U.S.A.

Vanderkooy, J. and Lipshitz, S. P., "Feedforward error correction in power amplifiers", *J. Audio Eng. Soc.*, vol. 28, pp. 2-16, Jan./Feb. 1980, U.S.A.

Giovanni Stochino, "*Audio Design leaps forward?*", Electronics World, Oct. 1994, pp. 818-827, vol. 100, N. 1703, United Kingdom.

K. B. Klaassen et al., "*Amplifier Systems With Quasifeed-Forward Control*", *Electronics Letters*, Aug. 21, 1975, vol. 11, No. 17, pp. 400-401, United Kingdom.

K. B. Klaassen et al., "*Comparison of Quasifeedforward- and Feedback-Controlled Amplifier*", *Electronics Letters*, Jun. 24, 1976, vol. 12, No. 13, pp. 318-319, United Kingdom.

D. Danyuk and G. Pilko, "*Error Correction in Audio Amplfiers*", *J. Audio Eng. Soc.*, vol. 44, No. 9, Sep. 1996 pp. 721-728, U.S.A.

D. Danyuk and M. J. Renardson, "*Error Correction in Class AB Power Amplifiers*", Presented at the 114th AES Convention, Mar. 22-25, 2003 Amsterdam, The Netherlands.

B. Duncan, "High Performance Audio Power Amplifiers", Newnes, 1996 ed. reprinted with revisions on 1997, United Kingdom.

W. Baggally, "Distortion Cancellation in Audio Amplifiers", Wireless Eng. & Experim. Wireless, vol. 10, pp. 413-429, Aug. 1933.

D. Bollen, "Distortion Reducer", Wireless World, Feb. 1973, pp. 54-57.

Meier, I. et al., "Error-feedback for amplifier linearization", Communications and Signal Processing, 1998, Comsig '98, Proceedings of the 1998 South African Symposium on Rondebosch, South Africa, Sep. 7-8, 1998, New York, NY, USA, IEEE, US.

International Search Report dated Feb. 22, 2012.

Written Opinion dated Jun. 21, 2011.

\* cited by examiner

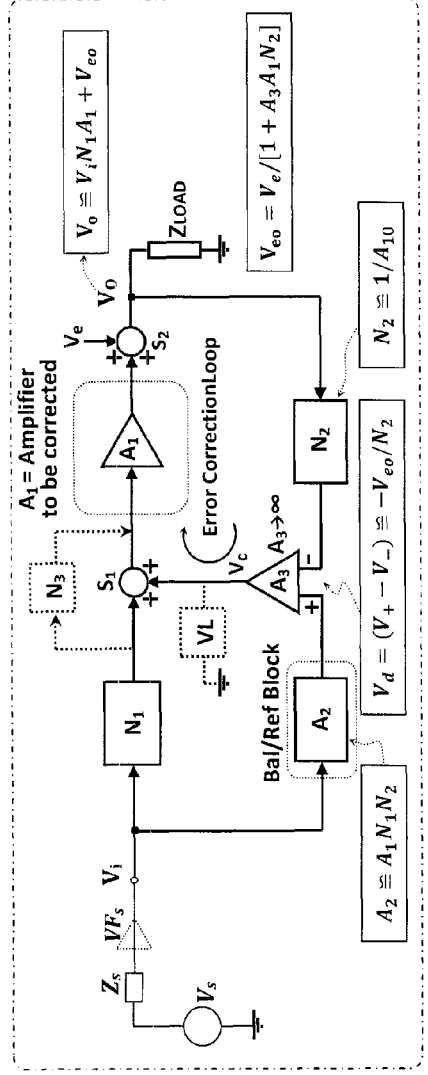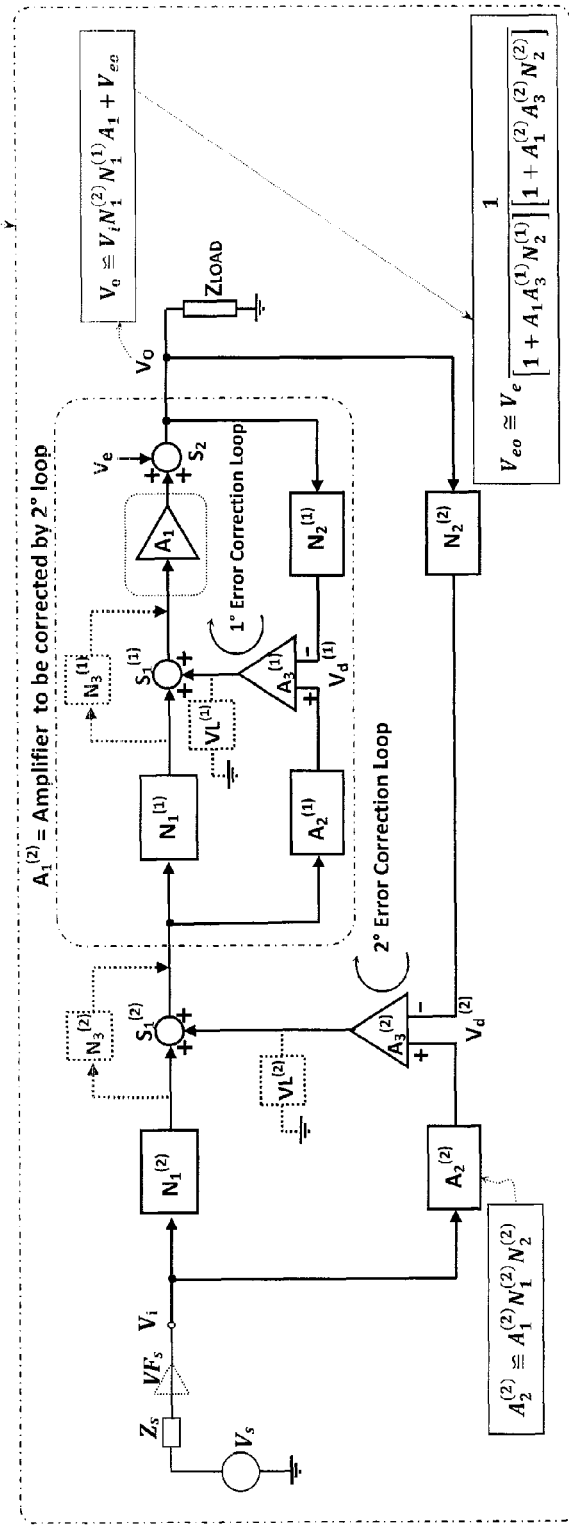

(a)- $f_T(A_3^{(1)})=f_T(A_3^{(2)})=f_{c1}(A_1)=10$MHz
(b)- $f_T(A_3^{(1)})=f_T(A_3^{(2)})=0.3\,f_{c1}(A_1)=3$MHz

Fig. 4b(2)

$f_T(A_3^{(1)})=f_T(A_3^{(2)})=0.06f_{c1}(A_1)=0.6$ MHz

Fig. 4b(3)

$THD_{MC}$ (BW= 200kHz)≈0.01000%

$f_T(A_3^{(1)}) = f_T(A_3^{(2)}) = f_{C1}(A_1) = 10\text{MHz}$

$THD_{NS}$ (BW=200kHz)≈0.00005%

Fig. 4c(4)

AMPLIFIER DEVICE WITH REITERABLE ERROR CORRECTION SCHEME WITH BALANCED NEGATIVE FEEDBACK

CROSS-REFERENCE TO RELATED APPLICATIONS

This application claims priority benefits under 35 USC 119 to Italian application RM2011A000321, filed on Jun. 21, 2011, the entire disclosure of which is hereby incorporated by specific reference thereto.

FIELD OF THE INVENTION

The present invention relates to an amplifier device allowing in a simple, effective, reliable and inexpensive way, to obtain both very high levels of DC and AC precision and very low levels of nonlinear, harmonic and intermodulation distortion, even lower than one part per million, in a very wide range of frequencies. More in particular, the amplifier device according to the invention uses a specific error correction scheme that is very much more efficient than the prior techniques and intrinsically reiterable, based on one or more error balanced negative feedback loops which allows to reduce the overall error down to extremely low values.

BACKGROUND OF THE INVENTION

In the following specification some numerical values are reported wherein the dot "." is used as separator between the integer and fractional parts of the value. Moreover, in the following specification and in the claims, where the type of connection is not expressly specified, the terms "connection" and "connected" (and their variations) should be intended as referring to a connection consisting in either a direct short-circuit connection or a connection through an interposed component (e.g. a voltage or current measuring component).

It is known that, along with the standard error correction techniques based on the fundamental concepts of the classical negative feed-back (sometimes simply called feed-back), widely used in both signal and power amplifiers, other supplementary error correction techniques have been developed during the last years, which are often synergically used in amplifier circuits with the most traditional ones for improving their distortion performance, and which can be basically grouped in four types.

The first type of supplementary error correction technique comprises the correction techniques internal to the main negative feedback loop, also known as "nested differentiating feed-back loops", e.g. disclosed by Edward M. Cherry in "*A new result in negative feedback theory and its application to audio power amplifiers*", Int. Journal Circuit Theory, Vol. 6, pp. 265-288, July 1978, in "*A Power Amplifier Improver*", J. Audio Eng. Soc., Vol 29, No. 3, pp. 140-147, March 1981, and in "*Nested differentiating feedback loops in simple power amplifiers*", J. Audio Eng. Soc., V. 30, pp. 295-305, May 1982, as well as in the U.S. Pat. No. 4,243,943 to Cherry. In such first type of technique, one or more special negative feedback loops are inserted along the signal path, which are characterized by pairs of poles-zeros inserted in proper position so as to increase the gain available at the highest frequencies without excessively altering the stability margins of the whole amplifier. Among the practical limits of such scheme, besides difficulties associated with the choice of the poles-zeros pairs and with their practical implementation, it should be considered that generally it includes the insertion, for each correcting loop, of some gain and/or support blocks along the signal path, which interfere with the response of the amplifier to correct, on the one hand, and which are in turn non negligible sources of further errors, on the other hand. Therefore, practically obtainable improvements are limited and such first type of supplementary error correction technique is not used in audio amplifiers with requirements of very low distortion limited to few parts per million in the whole audio frequency band.

The second type of supplementary error correction technique comprises the supplementary negative feedback techniques which add to the main loop, known as techniques of "active-error feedback", e.g. disclosed by W. Baggally in "*Distortion Cancellation in Audio Amplifiers*", Wireless Eng. & Experim. Wireless, Vol. 10, pp. 413-419, August 1933, by J. R. Macdonald in "*Active-Error Feedback and its Application to a Specific Driver Circuit*", Proc. IRE, vol. 43, pp. 808-813, July 1955, by D. Bollen in "*Distortion Reducer*", Wireless World, February 1973, pp. 54-57, and by U.S. Pat. No. 6,275,102 to Muza. In such techniques a supplementary error negative feedback correction loop is added, wherein the correction voltage is directly added to the input voltage with no need for insertion of additional blocks along the main signal path, thus being less invasive of the techniques of the first type. However, due to the high interactions that in such scheme the correction loop has intrinsically with the main useful signal path, it is practically impossible to exploit in the best way such potentialities and at the same to keep satisfactory dynamic stability margins of the corrected amplifier in every operative condition, and hence more in general a good "time-frequency response" of the corrected amplifier (in the present specification and in the claims, it is jointly and synthetically meant with "time-frequency response" the response in the time domain along with the one in the frequency domain). The frequency range wherein the active negative feedback loop may operate with adequate dynamic stability margins of the whole amplifier must be necessarily reduced in general to a modest fraction of the band wherein the correction loop could instead operate with good stability margins, consequently limiting the use of such techniques to applications with only one correction loop in audio amplifiers having few stages and in servo systems operating at low frequencies.

The third type of supplementary error correction technique comprises the feedback error-correction techniques, wherein the error is measured and extracted with high accuracy from the output and added with the same accuracy and with proper phase to the input signal, e.g. as disclosed by Malcom J. Hawksford in "*Distortion Correction In Audio Power Amplifiers*", J. Audio Engineering Society, Vol. 29, No. 1/2, 1981 January/February, and in "*Power amplifier output stage design incorporating error feedback correction with current damping enhancement*" presented at the 74$^{th}$ AES Convention, 1983, October 8-12, New York, by Robert R. Cordell in "*A Mosfet Power Amplifier with Error Correction*", J. Audio Eng. Soc., Vol 32, No. 1/2, 1984 January/February, and in the U.S. Pat. Nos. 5,892,398 and 6,600,367 to Candy. These techniques can be considered as a special application of the active-error feedback ones of the second type, with which they substantially share the same dynamic stability problems and mentioned applicability limits. Such techniques, though effective in principle for reducing distortion, are not very spread both because they are complex from a circuit and design point of view, and because of the unavoidable and expensive criticalities associated with them, since they require in general the use of critical circuits calibrated in a wide frequency band for accurately performing the error extraction and sum, which in turn are unfortunately sources of further errors, which, for the same nature of the correction mechanism, are not correctable by the same negative feedback loop introduced for correcting the error of the output stage.

The fourth type of supplementary error correction technique comprises the error feed-forward techniques, e.g. disclosed in the U.S. Pat. No. 1,686,792 to Black, by Vanderkooy J. and Lipshitz S. P. in "*Feed-forward error correction in power amplifiers*", J. Audio Eng. Soc., V. 28, pp. 2-16, January/February 1980, and in the Patent Application EP 1913687 and in the U.S. Pat. No. 7,564,304 to Stochino et al. Among these techniques, there are canonical techniques (also known as true error feed-forward), wherein the error correction loop is always outside possible negative feedback loops and hence which do not suffer from typical problems of dynamic stability from which the latter suffer, and the combined techniques (feed-back and feed-forward), wherein the feed-forward error correction is employed inside the general feedback loop, and that hence does not enjoy the unconditioned stability benefits which are instead enjoyed by the canonical feed-forward correction loops. The canonical techniques of pure feed-forward correction are based on mechanisms capable to accurately extract and isolate the error voltage of the amplifier to correct and to add it in anti-phase to the output signal, so as to virtually cancel its error. However, although much used in the radio-microwave field, such techniques suffer from some implementation problems, related to the need for delicate and expensive calibrations and to the presence of a transformer adder with magnetic flux cancellation that has limited and expensive application. Also, practical applications of such techniques are limited to power amplifiers with discrete components, and such techniques barely find convenient applications in the integrated circuit field.

BRIEF SUMMARY OF THE INVENTION

It is therefore an object of the present invention to allow an amplification capable to obtain, in a simple, effective, reliable and inexpensive way, both very high levels of DC and AC precision and very low levels of nonlinear, harmonic and intermodulation distortion, even lower than one part per million, in a very wide range of frequencies.

It is still an object of the present invention to allow such an amplification with high performance in both signal and power, in a wide range of amplifier circuits, e.g. for the audio, ultrasound, communication (e.g. video, xDSL, etc.), control and instrumentation fields.

It is specific subject matter of this invention an amplifier device, capable to receive at an input an input signal and to provide a load connected to at least one output terminal of the device with at least one output amplified signal, the device comprising at least one amplifier electronic block, having a transfer function $A_1$ between at least one input and at least one output, said at least one output of said at least one amplifier electronic block being connected to said at least one output terminal of the device, at least one input of said at least one amplifier electronic block being connected to an output of a respective adder of two input signals, a first input of the adder being connected to an output of a respective support electronic block, having a transfer function $N_1$ between an input and the output, an input of the support electronic block being connected to the input of the device, a second input of the adder being connected to an output of a respective error amplifier, the error amplifier having a non-inverting input and an inverting input and having a transfer function $A_3$ between a difference of signals present at the non-inverting input and at the inverting input and the output, a first input of the error amplifier selected from the non-inverting input and the inverting input being connected to an output of a respective attenuator electronic block, having a transfer function $N_2$ between an input and the output, the input of the attenuator electronic block being connected to at least one output of said at least one amplifier electronic block, the device being characterized in that it further comprises a balancing electronic block, having a transfer function $A_2$ between an input, that is connected to the input of the device, and an output, a second input of the error amplifier selected from the non-inverting input and the inverting input being connected to the output of the balancing electronic block, the transfer function $A_2$ being equal to the product $A_1 N_1 N_2$, with the second input of the error amplifier that is different from the first one.

Further aspects of the amplifier device according to the invention will be apparent from the following specification and the appended claims.

The innovative amplifier device according to the invention uses one or more loops of a novel mechanism of error correction with active negative feedback (hence of the type active-error feedback) based on a balanced scheme, intrinsically and easily reiterable, as shown in FIGS. 1*a* and 1*b* which will be described in detail later. Such loops are applied to the generic amplifier block $A_1$, with positive or negative gain, larger than or equal to 1, in order to reduce its error by many orders of magnitude in a much wider frequency band than the one obtainable with the prior techniques, substantially without interfering, in the correction process, with the path of the useful signal $V_i$ to amplify, whereby the corrected amplifier keeps the same response, in time and frequency, the same dynamic behavior and the same stability margins in amplitude and phase, of the non-corrected amplifier $A_1$. This result, that is original and unique in correction systems with active error negative feedback, is obtained by means of the reference and balancing block $A_2$, capable to decouple in a particularly simple and effective way the error correction loop from the main path of the useful signal $V_i$ in a wide frequency range and due to this reason the error correction technique according to the invention is defined hereinafter also as error correction technique with "balanced negative feedback" (or Balanced Error Feedback). In particular, the amplifier block $A_1$ the error of which is intended to be corrected may be either a single stage within a more complex amplifier, for instance its output stage (that is usually one of the main causes of distortion), or a multi-stage amplifier including its overall negative feedback loop. Moreover, although in FIGS. 1*a* and 1*b* the amplifier block $A_1$ is represented as a voltage amplifier, the architecture of the device according to the invention may be adapted to current amplifiers.

By way of example and not by way of limitation, the amplifier device according to the invention, preferably based on one or two correction loops, is advantageously applicable in amplifier circuits with high performance, in both signal and power, for the audio, ultrasound, communication (e.g. video, xDSL, etc.), control and instrumentation fields. In these preferred applications it is possible to obtain, in a simple way and with relatively low costs, both very high levels of DC and AC precision, and very low levels of nonlinear, harmonic and intermodulation distortion, even lower than one part per million, in a generally very wide range of frequencies when compared to the passband of the amplifier $A_1$.

Peculiar preferred embodiments of the device according to the invention comprise specific implementations and optimizations of critical portions of the error correction scheme, which are particularly effective for a full use of its theoretical correction potential, and which are therefore of more practical industrial interest. In particular, some original solutions for making the central portion of such architecture, constituted by the support block $N_1$, error amplifier $A_3$ and adder $S_1$, allow to manage and add the correction signal $V_C$ to the useful signal $V_i$ in a simple, effective and easily reiterable way. Even in case of components different from the amplifier block $A_1$ of the device according to the invention shown in FIGS. 1a and 1b, such as for instance the components $N_1$, $A_2$ and $A_3$, the used amplifiers can be voltage amplifiers or even current amplifiers.

The amplifier device with error correction according to the present invention overcomes in a simple and inexpensive way the main limits of the first, second and third types of prior techniques for error correction with negative feedback previously discussed, in particular both the system theoretical limits and the implementation practical limits, by offering more stable and higher error correction rates in a much wider frequency band when compared to such techniques.

Therefore, the device according to the invention can be used in a much more effective way, in terms of both costs and performance, for making amplifier systems with very high linearity, usable in a wide range of professional fields, in particular audio, ultrasound, communication (e.g. video, xDSL, etc.), control and instrumentation fields. With specific reference to the audio field, with the innovative technique of error correction with balanced negative feedback on which the present invention is based, it is possible to obtain distortion performance even better than one part per million, hence in line with the best performance obtainable with the technique of feed-forward error-correction discussed above, but at a lower cost and in a wider range of applications also including integrated circuits. Moreover, it is possible to use the technique of error correction with balanced negative feedback on which the present invention is based in synergy with the technique of feed-forward error correction, e.g. by using the former for linearizing the main amplifier in the apparatus described in U.S. Pat. No. 7,564,304, that in this way can reach levels of overall distortion (known as THD—Total Harmonic Distortion), including all the signal harmonics up to 100 kHz, even lower than $THD_{MAX}=0.00001\%$ in the whole audio frequency range and at all power levels.

In one of the preferred applications, wherein the block $A_1$ is a complete audio power amplifier, the most interesting and significant effect of this feature of decoupling from the useful signal $V_i$ is that the innovative technique of error correction allows to preserve the electrical and sound transparency of the amplifier $A_1$, that can be therefore designed with reduced complexity and number of stages, wider frequency band, higher response speed and lower negative feedback ratio, for improving its transparency and musicality, and for simultaneously reaching levels of nonlinear, harmonic and intermodulation distortion even lower than 0.0001% at every power level and in the whole audio frequency band.

In another preferred application, wherein the block $A_1$ is the output stage with unity gain, usually a class-AB one, of a voltage, signal or power amplifier, having a plurality of stages of operational type, the present invention allows to improve the precision and linearity performance of the amplifier without needing to reduce the open-loop gain-bandwidth product in order to keep the specified stability margins, and thus leaving its open-loop frequency response unaltered.

The innovative advantageous aspects of the device according to the invention, which substantially distinguish it from the previously discussed prior techniques, are basically four.

The first aspect is that each balanced negative feedback error correction loop of the device is completely decoupled from the main useful signal, i.e. from the input voltage $V_i$, that, inside the correction loop and already in open-loop conditions, is virtually rendered null at all the frequencies by the reference and balancing block $A_2$. Therefore, each one of the correction loops selectively operates on the error signal only, without substantially interfering with the main path of the useful voltage $V_i$. Such balancing necessary for minimizing the residual interference in a very wide frequency band is obtained with a proper configuration of the block $A_2$ and with an adequate dimensioning, that is generally not excessively critical, of its parameters and of its frequency response. At the system level, the most important result of decoupling the correction loop from the useful signal is that the response in the time and frequency domain of the amplifier (or more in general of the amplifier block) $A_1$ is not substantially altered by the error correction loop, whereby its dynamic stability margins, both in amplitude and phase, are substantially preserved in the process of error correction. This allows, on the one hand, to exploit much better than the prior techniques the error correction potential of the loop, or loops, with balanced negative feedback, that in this scheme can in general operate with significant effectiveness in a wider frequency range (typically at least 10 times wider than what possible with the prior techniques, on equal stability margins of the corrected amplifier), and, on the other hand, to easily extend its range of practical industrial applicability for including, besides the single stages of the amplifier, also multi-stage amplifiers and already provided with their own classical negative feedback loop.

The second innovative aspect is the intrinsic and easy reiterability of such correction technique, due to the property of negligible interference with the main useful signal path, whereby the correction mechanism can be, if needed, repeated a plurality of times inside the amplifier device, in a simple way and in different ways, and without introducing significant criticalities, for further reducing the overall error. More in particular, thanks to the substantial decoupling from the main signal path, the scheme of the error correction loop shown in FIG. 1a can be easily used more than one time (i.e. it is reiterable) in the amplifier device according to the present invention, both outside $A_1$ for correcting the entire amplifier, just as shown in FIG. 1a, and locally inside $A_1$ for reducing "at the source" the error of its single stages which are particularly critical due to their high contribution to the (linear and non-linear) error, such as for instance the output stage.

The third innovative aspect is that each error correction loop with balanced negative feedback, in the preferred embodiments herewith illustrated, is made so as to be able to correct, with no need for particular critical calibrations, not only the error of the target amplifier $A_1$ that is intended to be corrected, but also the error of all the parts just introduced for reducing such error, including the support block $N_1$, if any, the error amplifier $A_3$ and the correction voltage adder $S_1$, which constitute its fundamental core, as well as the optional blocks N3 and VL (shown in FIGS. 1a and 1b).

The fourth innovative aspect is the simplicity with which the correction technique on which the device according to the present invention is based is performed and implemented at circuit level in the preferred applications of this invention, that augments its usefulness and extends its potential low cost use to a very wide range of applications, both using discrete components and entirely made through monolithic bipolar and MOS technologies, i.e. inside integrated circuits. In such range of applications also includes both signal amplifiers and power amplifiers, and, finally, both (signal) open loop applications and (signal) closed loop configurations with overall negative feedback. In particular, the correction scheme can be applied with good effectiveness also to inverting amplifiers, i.e. with a negative gain of the amplifier block $A_1$ ($A_1<0$). In this case, for the device to operate properly, only some adaptations of the schemes of FIGS. 1a and 1b are necessary for maintaining the necessary phase relationships in the various circuit nodes, which are an essential requirement for the proper operation of the device. The most simple and immediate, but not unique, adaptation provides for instance that also the block $N_2$ has negative gain $A_2$ as $A_1$ and that the inverting and non-inverting inputs of $A_3$ are exchanged with each other.

The advantages offered by the device according to the invention are numerous.

First of all, the response of the target amplifier (or more in general of the amplifier block) $A_1$ to the useful signal and the response of the error correction loop with balanced negative feedback can be independently optimized (since they are controlled by different and barely interfering parameters) both in the design and simulation step and in the experimental testing and subsequent production step. It is generally convenient to first deal with the correction loop, by optimizing its performance and stability, and then to proceed to balancing the useful signal path for optimizing the time-frequency response of the corrected amplifier to the useful signal $V_i$.

Also, the rules to follow for optimizing the performance of both the loop di error correction and the time-frequency response of the whole corrected amplifier are the simple and well known ones of the systems with standard negative feedback and hence of easy implementation by a skilled person in the art.

Moreover, the substantial decoupling of the correction loop from the path of the useful signal $V_i$ permits not to alter more than negligibly the response in the time domain (such as the rise-time, the settling-time, and the slew-rate) and in the frequency domain (such as amplitude and phase) of the amplifier $A_1$ to correct, that can thus be optimized, depending on the design requirements, before and independently from the application of the correction loop.

Furthermore, thanks to the substantial decoupling of each correction loop from the useful signal, it is possible to repeat the process by using two or more correction loops, each having, when necessary, correction performances which are specialized and more suitable to the specific target amplifier block, which can be placed by the designer in the most crucial and strategic points of the whole device. By way of example and not by way of limitation, a loop can be for instance used for "locally and surgically" countering the most critical error source (e.g. the power stage at the output of the amplifier $A_1$), and a second loop for "organically" neutralizing the small error, residual from both the first correction loop inside the amplifier $A_1$ and the classical negative feedback loop around the entire amplifier $A_1$.

Also, the intrinsic implementation simplicity of the innovative error correction technique on which the device according to the invention is based (and consequently of the preferred circuit implementations thereof) allows its easy applicability to the best, known and well established architectures of amplifiers (audio, ultrasound, xDSL, video, etc.), both discrete and integrated, and even inside possible loops of overall negative feedback, without adding particular criticalities, for increasing its performance, both in terms of DC and AC accuracy and precision and in terms of harmonic and intermodulation distortion.

BRIEF DESCRIPTION OF THE DRAWING

The present invention will be now described, by way of illustration and not by way of limitation, according to its preferred embodiments, by particularly referring to the Figures of the enclosed drawings, in which:

FIG. 1a shows a general block diagram of a first embodiment of the amplifier device according to the invention;

FIG. 1b shows a general block diagram of a second embodiment of the amplifier device according to the invention;

FIG. 2a shows a circuit block diagram of a first application of the device of FIG. 1a;

FIG. 2b shows a circuit block diagram of a second application of the device of FIG. 1a;

FIG. 2c shows a circuit block diagram of a third application of the device of FIG. 1a;

DETAILED DESCRIPTION OF THE INVENTION

Figure 1C:
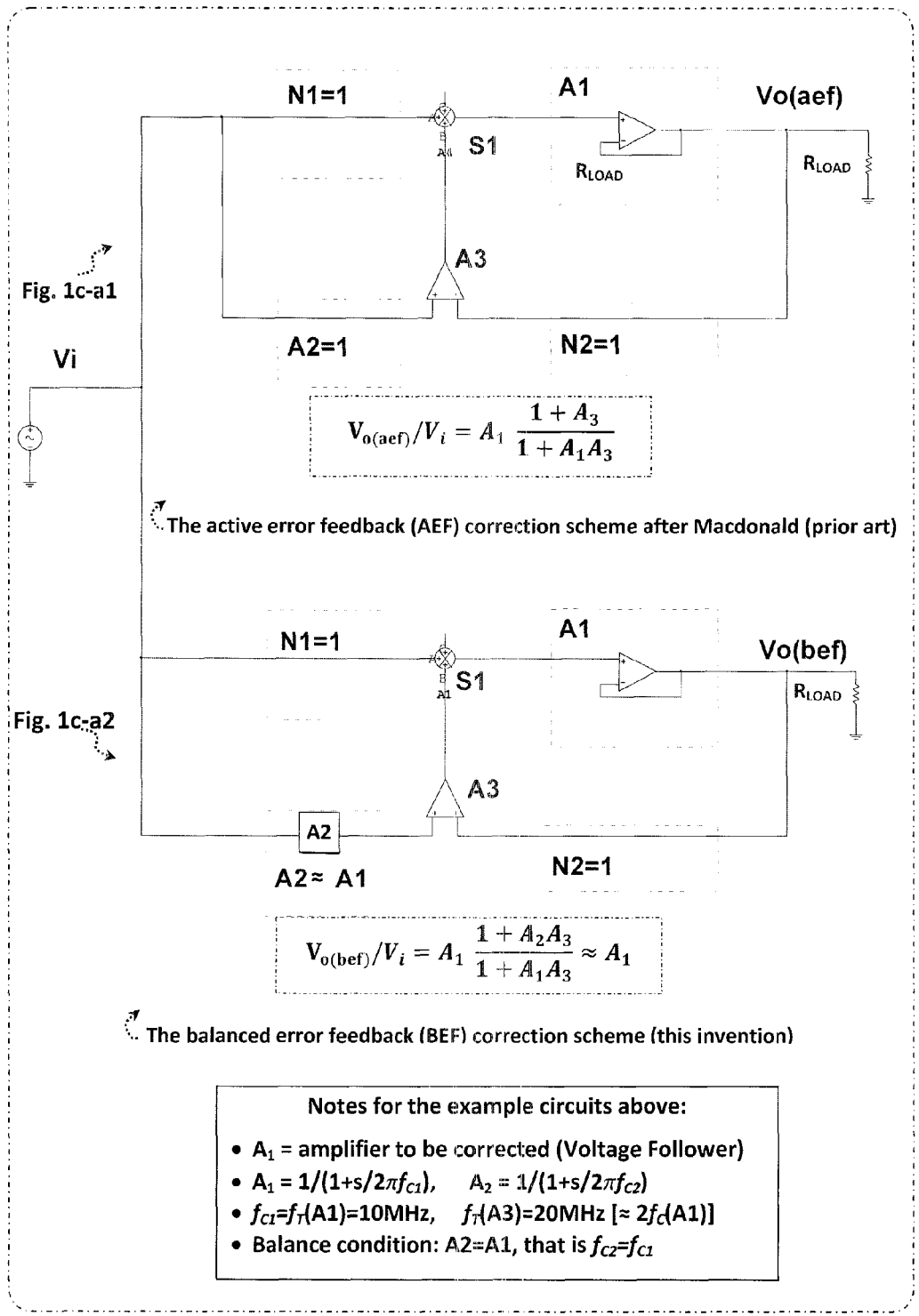
FIG. 1c shows a comparison between an amplifier device according to the prior art and the device of FIG. 1a and between the related performance.
Figure 1C:
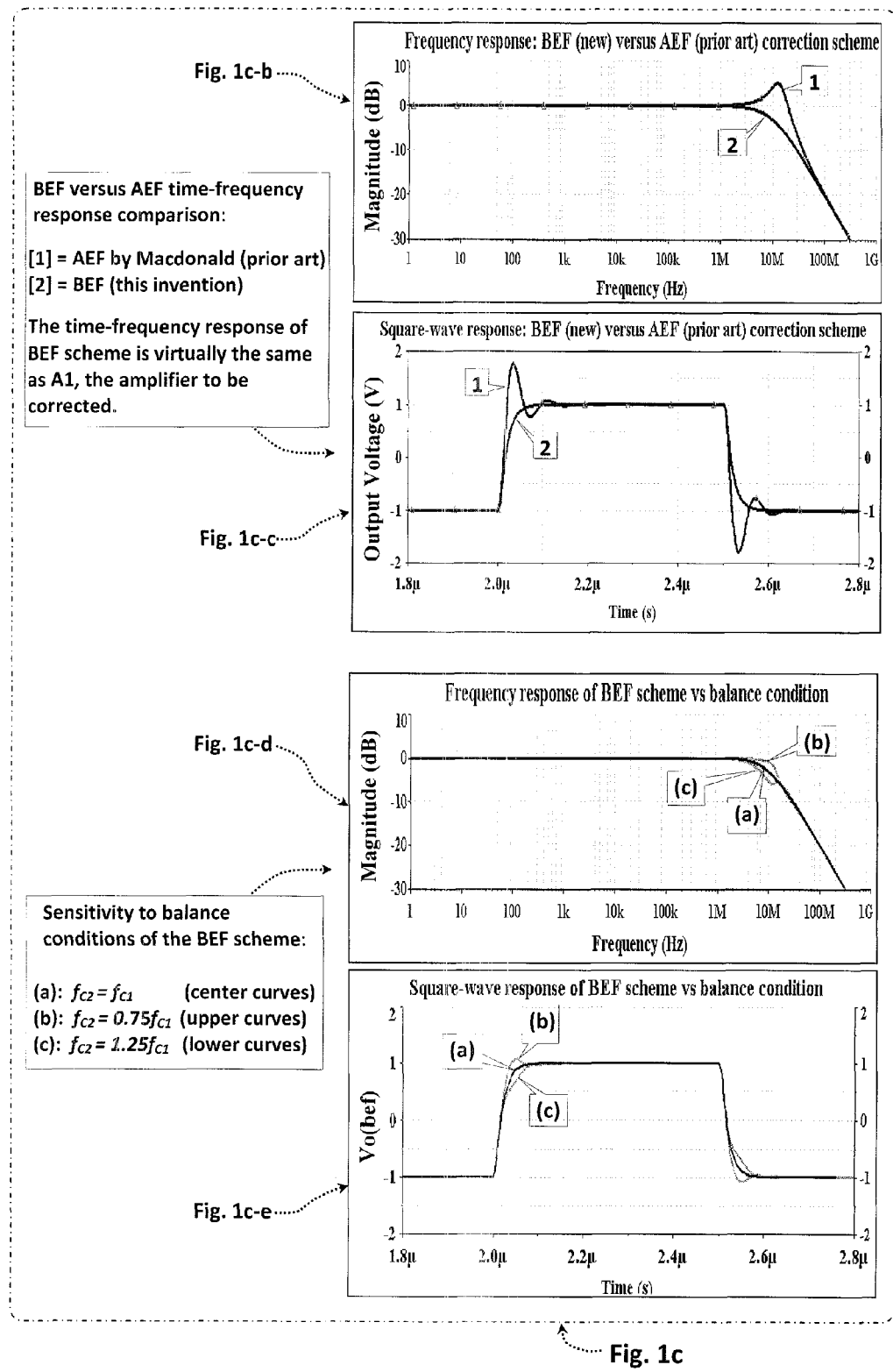

In the Figures, alike elements are indicated by same reference numbers.

In the following of this specification and in the claims, where the input or output type is not expressly specified, the terms "input" and "output" must be intended as including inputs and outputs of unbalanced (single ended) or balanced (balanced or differential) type.

FIG. 1a shows a general block diagram of a first embodiment of the amplifier device according to the invention, wherein also the main formulas (after calibration of the circuit components) are shown; in particular, the device of FIG. 1a has only one error correction loop with balanced negative feedback.

FIG. 1b shows a general block diagram of a second embodiment of the amplifier device, having two correction loops; the one of FIG. 1b is the embodiment provided with the most direct reiteration of the correction mechanism, that, however, is neither exclusive nor unique, since, as it will be described later, different forms of reiteration of the correction process are possible. The description of the operation of the device of FIG. 1b and of the related mathematical formulas which control the same can be made by considering the device with only one error correction loop shown in FIG. 1a.

In FIG. 1a (as well as in FIG. 1b), $A_1$ represents the target amplifier of the error correction process, that can be either a single stage one or a multi-stage one, with or without negative feedback, and it can be either a voltage or current amplifier, with inputs/outputs of unbalanced (single ended) or balanced (balanced or differential) type. $N_1$ and $N_2$ are two blocks, the former being a support one and the latter being an attenuation one, generally having functions specializable on a case by case basis. In many applications, $N_1$ is a unity gain support module (voltage follower), with functions of impedance separation from the source of the input signal $V_i$ and with bandwidth much larger than $A_1$, whereas $N_2$ is preferably a RC passive network, with the primary function of attenuating the output voltage bringing the same at a more convenient level (preferably, but not necessarily, at the same level of the input signal) and the secondary function of introducing, where possible and necessary, a phase lead for improving the performance of the correction loop. In the case where the source of the signal $V_S$ has very low output impedance $Z_S$ (i.e. $Z_S \to 0$) and adequate current availability, or even better in the case where it is decoupled through a good voltage follower ($VF_s$ in FIGS. 1a and 1b), $N_1$ is not necessary and it can be replaced with a direct short-circuit connection ($N_1 \equiv 1$). $A_2$ is a block with fundamental functions of balancing and reference for the whole device, that has the primary purpose of decoupling the error correction loop from the useful signal path and it is generally constituted by a passive network, preferably a RC or RLC one, with or without attenuation in its passband, that operates with a balancing function; in particular applications, the block $A_2$ can be also constituted by an active network, and in this case it generally operates also with a specific function of "reference block", besides the balancing one. $A_3$ is the error amplifier, assimilable in general to a signal amplifier with an output in voltage (or, if more convenient, in current, as described later), either unbalanced (unbalanced or single-ended) or balanced (balanced), and preferably characterized by a very high DC gain $A_{30}$, preferably larger than 40 dB, by low distortion, high precision (low bias and offset voltage and currents, low noise, high common mode rejection ratio or CMRR, etc.), adequately high dynamics and slew-rate (SR). $A_3$ has a transfer function preferably of the first order, i.e. of the type $$A_3 = V_c/V_d \approx A_{30}/(1+s/p_{30}),$$

dominated by the sole pole $p_{30}$ at least up to its unity gain frequency (i.e. the limit frequency of the band within which the modulus of the gain is not lower than 1) $f_T(A_3) \approx A_{30} p_{30}/2\pi$. Moreover $f_T(A_3)$ must have a proper value, depending on the transfer function of $A_1$, for ensuring dynamic stability to the error correction loop in all the operating conditions, and therefore if necessary it must be preferably easily adjustable.

In the schemes of FIG. 1a and FIG. 1b, $f_T(A_3)$ can in general assume a value lower than but very close to the cutoff frequency (i.e. the frequency at which the gain decreases by 3 dB) $f_C(A_1N_2)$ of the cascade of the two blocks $A_1$ and $N_2$ and, in the cases where $A_1$ has sufficiently high gain and good stability margins, it can also exceed the cutoff frequency $f_C(A_1)$ of $A_1$ if the block $N_2$ is properly used. $S_1$ indicates the adder adding the error correction voltage $V_C$ to the useful signal $V_i$. $V_O$ is the output voltage over the load $Z_{LOAD}$, whereas $V_e$ represents the total equivalent error voltage at the output, when the correction loop is open, i.e. before the correction, (for the sake of graphical representation ease it is inserted in series at the output of $A_1$ through the adder $S_2$), including not only the error of $A_1$ but also the error contribution generated by all the blocks of the scheme.

The error correction scheme presented herein is effective in reducing the error contribution of $A_3$ and of blocks $N_1$, $N_3$, VL, $A_1$ and $S_1$, all included within the correction loop, but not the one of the blocks immediately upstream of $A_3$, i.e. $A_2$ and $N_2$, since the error produced by these is not "distinguishable" from the useful signals present at their input and hence such error is not "correctable" by the correction loop. Therefore, the error contribution of $A_2$ and $N_2$ remains excluded by the correction process, however in the preferred and most frequent applications, wherein both $A_2$ and $N_2$ are constituted by well designed and dimensioned RC or RLC passive networks, such contribution to the overall error is very low and generally negligible.

The blocks $N_3$ and VL (indicated in dashed lines because they are not essential to the basic operation of the scheme) respectively constitute the bypass module of the correction mechanism beyond a proper frequency $f_{CB}$ (whereby for frequencies higher than $f_{CB}$ the output of the block $N_3$ is predominant over the output of the adder $S_1$) and the module for limiting the correction voltage (Voltage Limiter) within a predetermined range, which blocks are useful in some applications (not necessarily all of these), the former for avoiding dynamic instabilities and the latter for avoiding dangerous phenomena of overdrive of $A_1$, which can occur in critical operating situations (e.g. saturation of the output voltage $V_o$, intervention of current limiters, limitation of $dV_o/dt$ due to limited SRs, etc.).

With reference to FIG. 1a (and ignoring blocks VL and $N_3$ in the analysis), the output voltage $V_O$ is given by $$V_o = V_i N_1 A_1 \frac{1 + A_2 A_3/N_1}{1 + A_1 A_3 N_2} + V_e \frac{1}{1 + A_1 A_3 N_2} \qquad (1)$$

The voltage $V_d = V_{(+)} - V_{(-)}$ at the input of $A_3$ is equal to $$V_d = V_i \frac{A_2 - A_1 N_1 N_2}{1 + A_1 A_3 N_2} - V_e \frac{N_2}{1 + A_1 A_3 N_2} \qquad (2)$$

The denominator at the right side of the two preceding equations is typical of the classical equation of a negative feedback loop, the dynamic stability of which is ensured, as it is well known, if at all the frequencies the following condition is satisfied $$1 + A_1 A_3 N_2 \neq 0 \qquad (3)$$

and this condition must be obviously met in the implementation of the error correction scheme according to the invention, starting from the basic Bode stability criterion that requires a decrease of the loop gain $G_a = A_1 A_3 N_2$ in function of the frequency non exceeding 30 dB/decade in proximity of its unity gain frequency $f_T(G_a)$. On the other hand, equation (1) also highlights that the output error voltage $V_{eo} = V_e/(1 + A_1 A_3 N_2)$ is as much attenuated at the highest frequencies as the function $G_a$ is high at such frequencies. It follows that for having a significant correction potential of the correction loop it is necessary to have a $f_T(G_a)$ as much high as possible, however still in conditions of good dynamic stability and hence satisfying the Bode criterion. In general, assuming that $N_2$ is a resistor network, this criterion requires that the function $G_a$ has not more than two poles in the range $f < f_T(G_a)$, one of which being constituted by the dominant pole $p_{30}$ of $A_3$, and the other one, belonging to $A_1$, must necessarily be in proximity of its cutoff frequency $f_C(A_1)$ in order to satisfy the Bode criterion. A practical rule allowing to satisfy the Bode stability criterion in the current context is that the unity gain frequency of $A_3$, i.e. $f_T(A_3)$, must never exceed the cutoff frequency $f_C(A_1 N_2)$ of the product function $A_1 N_2$, in proximity of which cutoff frequency $f_C(A_1 N_2)$ the first poles of the product function $A_1 N_2$ are located, i.e. it must always be $f_T(A_3) \leq f_C(A_1 N_2)$.

In general, when $A_1$ is constituted by a single amplifier stage (e.g. a simple voltage follower) or by a multi-stage amplifier with dominant pole (e.g. an operational amplifier with gain-bandwidth product equal to its unity gain frequency and with negative feedback for providing closed loop gains $G_{CL} \geq 5$) and hence having a transfer function with one single pole located in proximity of its cutoff frequency, there can be acceptable conditions of dynamic stability even with $f_T(A_3) \approx f_C(A_1 N_2)$. Instead, when $A_1$ has a transfer function with multiple poles, some of which close to $f_C(A_1 N_2)$, $f_T(A_3)$ must be necessarily lower than $f_C(A_1 N_2)$ for having adequate dynamic stability. Therefore, the available maximum correction potential of the correction loop, whereby it is still possible to have good stability margins of the loop, is for $f_T(A_3) = f_C(A_1 N_2)$, i.e. when the ratio $R = f_T(A_3)/f_C(A_1 N_2)$ is unity. Such value $R = R_{OPT} = 1$ can be defined as optimal ratio. The value of R obtainable in practical cases is usually included in the range $0.4 R_{OPT} < R < R_{OPT}$, and its actual value depends on the number and location of the poles of $A_1$.

Making reference to equations (1) and (2), it is possible to observe that the scheme of FIG. 1a offers an optimal balance condition when $$A_2 = A_1 N_1 N_2 \quad (4)$$

which condition, due to the fact that the two functions to equalize can be polynomial functions of the same type and degree which are compatible with the nature of the various blocks, and in particular with $A_1$ constituted by an active block and $N_2$ by a passive block, is intrinsically feasible with good approximation on a very wide frequency band. Obviously, equality in equation (4) is to be intended as nominal, in the sense that it is to be intended as satisfied apart from tolerable percentage deviations in the specific application context.

Therefore, when equation (4) is satisfied, the two equations (1) and (2) become, respectively $$V_o = V_i N_1 A_1 + V_e \frac{1}{1 + A_3 A_1 N_2} = V_i N_1 A_1 + V_e / \rho(f) \quad (5)$$

and $$V_d = -V_e \frac{N_2}{1 + A_3 A_1 N_2} \quad (6)$$

In equation (5), the ratio of error reduction at frequency f has been indicated with $\rho(f) = [1 + A_3(f) A_1(f) N_2(f)]$, which ratio is obviously equal to the gain of the correction loop at the same frequency f.

As shown by equations (5) and (6), when equation (4) is satisfied, on the one hand, the transfer function $V_o(V_i) = V_i N_1 A_1$ is identical, independently from $A_3$, to the one of the main path of the useful signal (i.e. the cascade of blocks $N_1$ and $A_1$) in absence of the correction loop, and, on the other hand, the input voltage of the correction amplifier $A_3$ does not contain the useful input voltage $V_i$ but only the error voltage $V_e$.

FIG. 1c shows the basic block diagrams of two circuits one of which (FIG. 1c-a1) uses the error correction technique disclosed by J. R. Macdonald in "*Active-Error Feedback and its Application to a Specific Driver Circuit*", Proc. IRE, vol. 43, pp. 808-813, July 1955, also known as "Active Error Feedback" (in the following and in FIG. 1c also indicated as AEF), whereas the other one (FIG. 1c-a2) uses the novel error correction technique of the device according to the present invention that, in view of the balance requirement expressed by equation (4), is defined in the present specification as "Balanced Error Feedback" (in the following and in FIG. 1c also indicated as BEF). The two techniques are applied to a simple amplifier A1 having unity gain and transfer function with one single pole, and for the sake of simplicity, as shown in the Figure, it is considered the case where N1=N2=1. The open-loop gain $A_{OL}$ and the unity gain frequency $f_T$ of both A1 and A3 are equal for the AEF and BEF circuits of FIG. 1c. The results of the simulations of the related time-frequency responses are reported sideways to the electrical schemes, so as to compare the main characteristics and performance of the two error correction techniques: FIG. 1c-b shows the frequency responses of the circuits of FIGS. 1c-a1 and 1c-a2; FIG. 1c-c shows the time responses of the circuits of FIGS. 1c-a1 and 1c-a2 to a square wave; FIG. 1c-d shows the frequency responses of the circuit of FIG. 1c-a2 under variation of the balance condition; FIG. 1c-e shows the time responses of the circuit of FIG. 1c-a2 to a square wave under variation of the balance condition.

At the functional level, the fundamental difference between the two circuits is constituted by the fact that in the AEF scheme of FIG. 1c-a1 the error amplifier A3 compares the output voltage V0 directly with the input voltage V1, that operates as reference of the error correction loop, and therefore it is always entirely present at the non-inverting terminal of A3, and hence in the difference voltage Vd, independently from the response of A1. Differently, in the BEF scheme of FIG. 1c-a2, the error amplifier A3 compares the output voltage with, instead of the input voltage Vi, the output voltage of the balancing/reference block A2, that in balance conditions (A2=A1) emulates the time-frequency response of the amplifier A1 to correct, with the effect (that is characteristic of the innovative technique of the invention) that at the input of A3 the component of useful signal Vi is practically reduced to zero at all the frequencies, whereby the voltage Vd will contain only the nonlinear distortion components unavoidably produced by A1 that delivers high currents to the load $R_{LOAD}$ (along with minor linear distortion components caused by the variations of the gain of A1 due to the variations of the load with respect to its nominal value). These components, all included in Veo, are present unaltered at the inverting terminal of A3, whereby it is Vd≈−Veo. Therefore, contrary to what occurs in the AEF scheme of FIG. 1c-a1, in the BEF scheme of FIG. 1c-a2 the difference voltage Vd at the input of A3 exclusively contains the components of the error Veo produced by A1, whereas the components of the input signal Vi are virtually absent. As the formulas related to the transfer function of the two schemes, still reported in FIG. 1c, effectively and synthetically show, this difference has a fundamental impact on the dynamic performance of the two schemes as highlighted by the simulations of both the frequency response and the time response included in the same FIG. 1c. In summary, the AEF scheme of FIG. 1c-a1 shows a time-frequency response not too much dissimilar from that of a classical negative feedback scheme, with the related problems of dynamic stability, as shown in FIG. 1c-b by the peak of the frequency response in proximity of $f_C$ (A1) and in FIG. 1c-c by the over-elongation of the response to the square wave, whereas the BEF scheme of FIG. 1c-a2, thanks to the substantial decoupling of the correction loop from the useful signal path and to the fact that the correction loop is stimulated only by the error component Veo, does not interfere with the time-frequency response of the amplifier to correct, and the dynamic response of the "corrected" device is practically coinciding with that of A1 without the correction mechanism.

At the system and mathematical level, the BEF scheme of FIG. 1c-a2 substantially differs from the prior AEF one of FIG. 1c-a1 in that, since the latter has no balancing/reference block but instead a simple direct short-circuit connection bringing the useful signal Vi directly back to the input of the error amplifier A3, the equivalent, though only hypothetical, balance condition for the AEF scheme similar to the one expressed by the preceding equation (4), considering the case more general than that of FIG. 1c wherein N1=1 and N2≠1, would be equal to $$A_1 N_2 = 1 \qquad (4b)$$

Such equation (4b) is intrinsically very different from equation (4) since, due to the fact that it has not polynomial functions of the same type and compatible with the nature of the blocks as its own members, it does not admit real solutions and it can be satisfied with good approximation, in amplitude and phase, only in a very limited frequency range that practically never exceeds about one tenth of the passband $f_C(A_1 N_2)$ of the cascade $A_1 N_2$. Such situation is as much burdensome as the gain of $A_1$ is low and $N_2$ cannot be used for extending $f_T(A_3)$ beyond $f_C(A_1)$, and hence the operating band wherein the effect of the correction is effective. The result of this limit typical for the prior techniques of error correction is a high interaction of the correction loop with the useful signal path, whereby the time-frequency response of the corrected amplifier is very different from that of $A_1$, and the resulting dynamic stability is often unacceptably compromised. For obtaining time-frequency response and stability margins similar to those of $A_1$ it is necessary to greatly reduce $f_T(A_3)$, and hence the resulting ratio R is unavoidably well below its optimal value $R_{OPT}$ described above. It is often necessary to drop to values of R<0.1 thus under-using the high potential of the correction loop.

Conversely, in the present invention, thanks to the possibility of balancing in a much wider frequency band offered by equation (4) that eliminates the interference of the correction loop with the main signal path, thus keeping the same time-frequency response and the same stability margins of $A_1$, it is possible to use a much larger ratio $R = f_T(A_3)/f_C(A_1 N_2)$ (with respect to the prior art techniques of error correction) and generally very close to the optimal value $R_{OPT} = 1$. In this way, all, or almost all, the available correction potential of the correction loop can be used and therefore high error reduction ratio can be obtained for each loop in a much wider frequency band.

The absence of the voltage $V_i$, or at least the presence of relatively very low values of $V_i$, at the input of $A_3$ (see equation (6)) produces another significant benefit. Contrary to what occurs in all prior schemes of error correction with negative feedback, in the scheme of FIG. 1a (and similarly in the double loop one of FIG. 1b), under conditions of good balance the error amplifier $A_3$ is not forced by the negative feedback to provide burdensome contributions of (voltage and/or current) signal for remedying the deficiencies of the gain of $A_1$ particularly at high frequencies. Instead, since it is generally stimulated only by the nonlinear error signal that is typically much lower than the useful signal (i.e. $V_e \gg V_i$), $A_3$ favorably operates with much more limited output dynamics, and therefore its potential contribution to the overall error of the device is definitely lower.

Moreover, independently from the balance condition given by equation (4), at low-frequency, and hence in the useful band where $A_3 \to \infty$ (i.e. for $f \ll f_T(A_3)$, preferably for $f < 0.2 \cdot f_T(A_3)$), the transfer function $V_o(V_i)/V_i$ is determined by the lower blocks of the scheme of FIG. 1a (and similarly in the double loop scheme of FIG. 1b), i.e. by $A_2$ and $N_2$, whereby $A_2$ also assumes the role of reference block. Instead, at high frequency, where $A_3 \to 0$ (i.e. for $f \gg f_T(A_3)$, preferably for $f > 5 \cdot f_T(A_3)$), the transfer function $V_o(V_i)/V_i$ is determined by the upper blocks, i.e. by $N_1$ and $A_1$. This is analytically expressed by the following equations, wherein $V_e = 0$ is imposed, $$\lim_{f \to 0} V_o(V_i)|_{(V_e=0)} = V_i A_2 / N_2 \qquad (7)$$

$$\lim_{f \to \infty} V_o(V_i)|_{(V_e=0)} = V_i A_1 N_1 \qquad (8)$$

Equation (7) expresses a second characteristic property of the scheme of FIG. 1a: the transfer function, at low-frequency, preferably for $f < 0.2 f_c(A_1)$, is determined only by blocks $A_2$ and $N_2$ and it is equal to $$V_o / V_i \cong A_2 / N_2$$

Hence, the block $A_2$ can be used with two substantially independent roles. In its first role $A_2$ performs its primary function of balancing expressed by equation (4), that must be first satisfied at the highest frequencies, preferably for $f > 0.2 f_c(A_1)$, so that the corrected amplifier $A_1$ can preserve the same stability margins which it had before the correction. In its second role, thanks to the property expressed by equation (7), the block $A_2$ can be also used for controlling, in both amplitude and phase, the response of the whole circuit at low frequencies, preferably for $f < 0.2 f_T(A_1)$, and this does not produce unacceptable interferences with its primary function of balancing. This property can be useful, for instance, in the case where it is proper and/or necessary to introduce an equalization $\epsilon(f)$, of amplitude or phase, of the frequency response of the circuit. By way of pure example, and not by way of limitation, such equalization could be reasonably included in the range $[-6\text{ dB} < |\epsilon(f)| < +6\text{ dB}]$ for the amplitude and in the range $[-25° < \phi[\epsilon(f)] < 25°]$ for the phase.

Just thanks to property of the scheme in FIG. 1a, whereby the transfer function of the corrected amplifier under balance conditions is virtually coinciding with that in absence of correction, i.e. $V_o = V_i N_1 A_1$, the correction mechanism can be easily reiterated at least another time for further reducing the error of the device, as shown by way of example in the scheme of FIG. 1b, where the amplifier to correct in this case is constituted by the amplifier already corrected a first time (shown in FIG. 1a) that is indicated as $A_1^{(2)}$. Obviously all the considerations already previously made for FIG. 1a are valid, and hence all the discussed equations, being careful to replace the symbols with the corresponding ones with the superscript (1), i.e. $A_1^{(1)}$, $A_3^{(1)}$, etc., for the first loop of error correction and with the superscript (2), i.e. $A_1^{(2)}$, $A_3^{(2)}$, etc., for the second loop of error correction.

More in general, thanks to the substantial decoupling from the main signal path, the scheme of the error correction loop shown in FIG. 1a can be easily used more than once (i.e. it is reiterable) in the amplifier device according to the present invention, both outside $A_1$ for correcting the entire amplifier, as just shown in FIG. 1a, and locally inside $A_1$ for reducing "at the source" the error of its single stages which are particularly critical for their high (linear and nonlinear) error contribution, such as for instance the output stage.

Figure 2A:
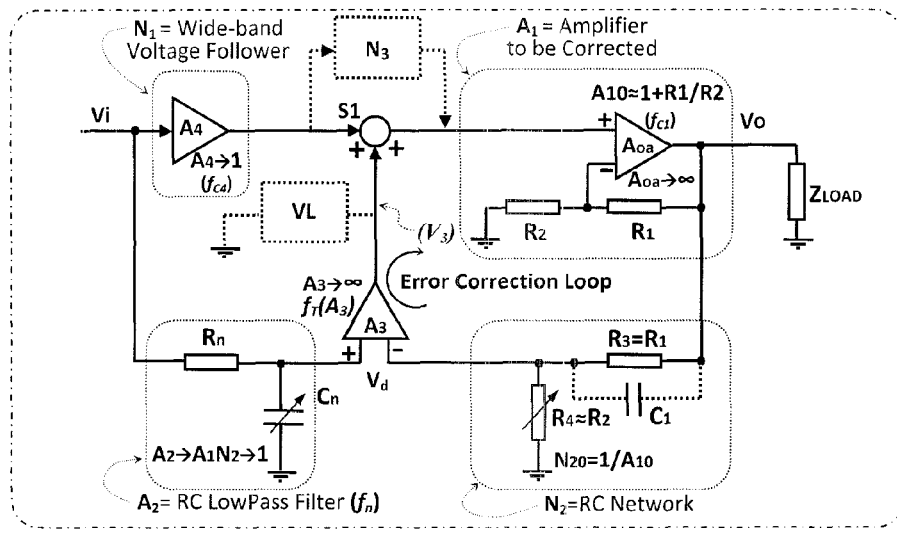

FIG. 2a shows a circuit block diagram of a first preferred application of the device of FIG. 1a, wherein the target amplifier $A_1$ to correct is a non-inverting amplifier with gain $A_1 > 1$. In particular, the amplifier $A_1$ is a typical non-inverting multi-stage amplifier already with a classical negative feedback loop, preferably with high dynamic stability margins, which can be either a signal or a power amplifier, and that is characterized by a frequency response of low-pass type, preferably of the first order, or of the second order and with sufficiently high damping coefficient $\zeta$, preferably $\zeta > 0.8$, with positive DC nominal gain $A_{10} > 1$ and having a cutoff frequency at −3 dB equal to $f_C(A_1) = f_{C1}$. In this regard, FIG. 2a shows that the open-loop gain of the classical negative feedback structure of $A_1$ is provided by the amplifier Aoa, of operational type in either integrated or discrete form, whereas the DC closed loop gain is equal to $A_{10} \approx (1+R_1/R_2) \geq 1$.

$N_1$ is constituted by a voltage follower with nominal unity transfer function, i.e. $A_4 \rightarrow 1$, having cutoff frequency at $-3$ dB equal to $f_{C4} \gg f_{C1}$ (preferably $f_{C4} > 5 \cdot f_{C1}$); the block $N_2$ is constituted by a simple resistor network with attenuation ratio equal to $N_2 = 1/A_{10}$. Therefore, taking account of equation (4), the block $A_2$ may perform the desired balancing of the whole device with a transfer function equal to $A_2 = A_1 N_1 N_2 = A_1 A_4/A_{10}$, and this is generally possible with a simple passive low-pass filter with one or two poles of RC or RLC type; in most favorable cases, as shown in FIG. 2a, the block $A_2$ may comprise a very simple RC network, with one single pole and having null attenuation at low frequencies. The balancing of the device is obtained in DC, if necessary, through the variable resistor $R_4$ of the block $N_2$, whereas the balancing in AC is obtained, for instance, through the variable capacitor Cn of the block $A_2$.

The FIG. 2a shows a first application of the device with only one error correction loop of FIG. 1a; this is made only for ease of analysis, because a similar application can be also made for the device with two error correction loops of FIG. 1b.

With regard to the balance condition expressed by equation (4), considering that $A_4 \approx 1$, and, $f_{C4} \gg f_{C1}$ (preferably $f_{C4} > 5 \cdot f_{C1}$), it becomes with good approximation $$A_2 = A_1 A_4 N_2 \approx A_1 N_2 \quad (4')$$

Considering the case where the transfer function of $A_1$, besides that of $A_4$, can be described with good approximation with one single real pole (case that is realistic when the negative feedback ratio of $A_1$ is minor and $A_{10}$ is high), it is $$A_1 = \frac{A_{10}}{1+s/p_1} \quad (9a)$$

$$A_4 = \frac{A_{10}}{1+s/p_4} \quad (9b)$$

with $p_1 = 2\pi f_{C1}$, and $p_4 = 2\pi f_{C4} \gg p_1 = 2\pi f_{C1}$ (preferably $p_4 > 5 \cdot p_1$), and wherein $N_2$ is a resistor network with attenuation of value equal to the nominal DC gain $A_{10}$, i.e. $N_2 = 1/A_{10}$. In this case the condition of perfect balance expressed by equation (4') becomes $$A_2 = A_1 N_1 N_2 = \frac{A_1 A_4}{A_{10}} = \frac{1}{(1+s/p_1)(1+s/p_4)} \cong \frac{1}{(1+s/p_1)} \quad (10)$$

equivalent to the transfer function of a simple low-pass RC filter with two real poles, $p_1$ and $p_4$ in the more general case, and with one single real pole in the case under consideration of $p_4 \gg p_1$ (preferably $f_{C4} > 5 \cdot f_{C1}$), and having unity gain at low frequencies, and hence easily implementable, as indicated in the same FIG. 2a. It is possible to adjust the capacitor Cn, as mentioned above, or the resistor Rn, for performing the optimal balancing of $A_2$ whereby the pole introduced by the RnCn network exactly coincides with the pole $p_1$ of $A_1$. Small deviations from the situation of ideal balance are not particularly critical.

Even the more realistic case of an amplifier $A_1$ with two real or complex conjugate poles $p_1$ and $p_2$, both with real part much lower than $p_4$ (i.e. $\Re (p_1,p_2) \ll p_4$), preferably $\Re (p_1,p_2) < 0.2 \cdot p_4$) and with sufficiently high damping factor $\zeta$, preferably $\zeta > 0.8$, can be balanced in a similar way even if it is a little bit more complex and critical than the previously assumed case. Such a case is present for instance when the negative feedback ratio approaches its maximum value and the gain $A_{10} \rightarrow 1$. In this case, with considerations similar to the case of one single pole, the balance condition becomes $$A_2 \cong \frac{1}{(1+s/p_1)(1+s/p_2)} \quad (11)$$

equivalent to the transfer function of a simple low-pass filter with two poles with null insertion attenuation, that is also easily implementable with a RLC network in the more general case and with a RC network in the particular case of two real poles.

In the most general case, the best balance is obtained in the hypothesis of $N_1 \approx 1$, i.e. $p_4 \gg p_1$ (preferably $p_4 > 5 \cdot p_1$), with the use of a block $A_2 = A_1 N_2$, i.e. constituted by an amplifier "identical" to $A_1$ with regard to configuration and time-frequency response followed by a network "identical" to $N_2$. In this way, the equation (4) is identically satisfied and the balancing is optimal at all the frequencies. From a practical point of view, it is not necessary that $A_1$ and $A_2$ are "functionally" identical, but it is sufficient that they have the same circuit structure and the same type of components, so as to have the same time and frequency response. For instance, it is not necessary that $A_2$ has same output current capabilities as $A_1$, since it has not to drive important loads, and therefore its output stage may be "scaled", i.e. proportionally reduced in terms of current and power capabilities, though the same time-frequency response of the amplifier $A_1$ has to be maintained. In fact, $A_2$ operates with loads $Z_2 \rightarrow \infty$ and hence with very small current delivery, whereby it can intrinsically have much less distortion than $A_1$ and hence it can assume the role of reference amplifier for $A_1$. The output of $A_1$, in view of the error correction loop, will tend to have at the output in the useful band the same low error of $A_2$, even if it operates with loads $Z_{LOAD}$ much more burdensome.

Figure 2B:
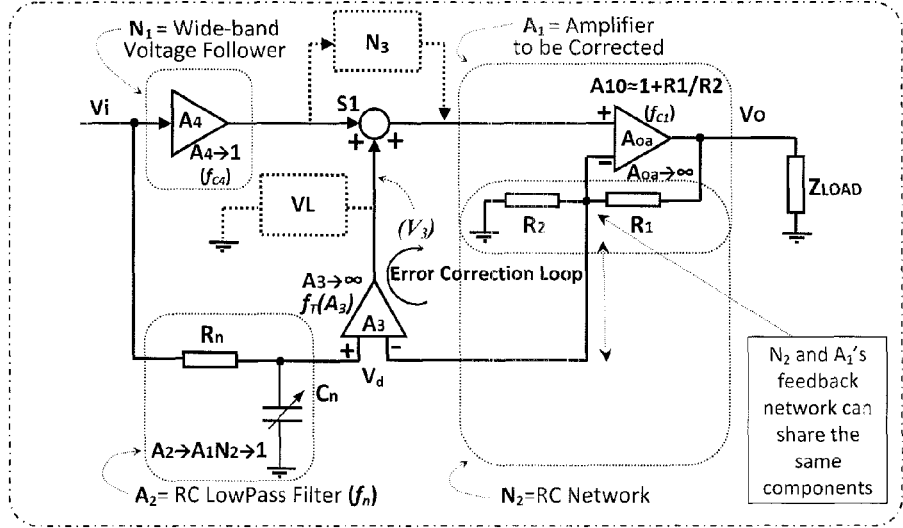

As shown in FIG. 2b, it is possible that the resistor network $R_1$-$R_2$ of negative feedback of $A_1$ is shared by the supplementary correction loop for performing also the functions of the block $N_2$. The circuit gets simplified, since $R_3$ and $R_4$ are eliminated along with the possible adjustment of $R_4$, but due to the input currents of $A_1$ flowing in the shared feedback network, both the general error and the distortion are worst than in the case of two separated negative feedback networks shown in FIG. 2a. Such negative effect can be much reduced by using sufficiently low values of $R_2$ and, proportionally, of $R_1$.

Making still reference to FIG. 2a, with regard to the condition of dynamic stability expressed by equation (3) related to the correction loop with balanced negative feedback, what said before about the necessity of meeting the Bode criterion is valid and consequently, in case of a multi-stage amplifier $A_1$ (and hence with multi-pole transfer function), the constraint expressed by the relationship $f_T(A_3) \leq f_C(A_1 N_2)$ is also valid. Such constraint must be in any case dealt with, in the implementation step of the low distortion amplifier device of FIG. 2a, along with the need for having a $f_T(A_3)$ as much high and close to $f_C(A_1 N_2)$ as possible, in order to have a ratio R close to $R_{OPT}$ and hence a correction ratio $\rho(f)$ as much high as possible at high frequencies. In the following, it is realistically assumed that $A_1$, in line with the initial hypothesis of high stability margins, has a dominant pole $p_1$ that determines the value of $f_C(A_1)$ and a second pole $p_2$ located between $p_1$ and its unity gain frequency $f_T(A_1)$, and that the subsequent poles ($p_3$ and then in sequence $p_4 \ldots p_N$) are located beyond $f_T(A_1)$. First of all, if $N_2$ is a simple resistive attenuator, it is $f_C(A_1N_2)=f_T(A_1)$, whereby it must also be $f_T(A_3) \le f_C(A_1)$ for stability reasons. Also, there exists the possibility to use the network $N_2$ for increasing the value of $f_T(A_3)$ still keeping good stability margins of the error correction loop. Such possibility implies the use of $N_2$ for introducing a phase lead in the transfer function $A_3A_1N_2$, in a proper frequency range, so as to satisfy the Bode criterion in correspondence of the unity gain frequency. This occurs by inserting the capacitor $C_1$ into the block $N_2$ as shown (in dashed lines) in FIG. 2a, through which a pole-zero pair ($p_n$, $z_n$) is created, which pair is typical of the phase lead network that is thus formed, wherein the pole-zero distance in frequency is equal to the value of the DC attenuation $A_{10}$ of $N_2$ and that produces a maximum phase lead $\Delta\phi(max) \le 90°$ halfway, on a logarithmic scale, between the zero and the pole. For the mechanism to be effective, it is first of all evidently necessary that the attenuation $A_{10}$ is larger than 1 and its effectiveness will be potentially as greater as $A_{10}$ is higher, completely disappearing when $A_{10}=1$. In fact, the transfer function of $N_2$ becomes:

$$N_2 = \frac{1}{A_{10}} \frac{(1+s/z_n)}{(1+s/p_n)} \quad (12)$$

where $z_n=R_1C_1$ and $p_n=A_{10}z_n$. By properly positioning the pole-zero pair so that the zero $z_n$ is ranging between the two poles of $A_1$, i.e. so that it is $p_1 \le z_n \le p_2 < p_n$, the frequency $f_T(A_3)$ can reach and even exceed the second pole $p_2/2\pi$ of $A_1$ still meeting the Bode criterion and hence with good stability margins. If also the second pole of $A_1$ is beyond $2\pi f_T(A_1)$, then there occurs again the situation, optimal from the correction ratio point of view wherein $f_T(A_3) \approx f_T(A_1)$. In fact, in such conditions, $A_1$ has a response approximately of the first order, whereby, by selecting the value of $C_1$ so that $z_n=p_1$ and hence $p_n=A_{10}p_1 \approx 2\pi f_T(A_1)$, it is $$A_1N_2 \cong \frac{A_{10}}{(1+s/p_1)} \frac{(1+s/z_n)}{A_{10}(1+s/p_n)} = \frac{1}{1+s/p_n} = \frac{1}{1+s/(A_{10}p_1)} \quad (13)$$

i.e. it is obtained the result of cancelling with $z_n$ the first pole $p_1$ of $A_1$ and of extending the cutoff frequency of the cascade $A_1N_2$ to the value $f_C(A_1N_2)=A_{10}p_1/2\pi \approx f_T(A_1)$.

Hence, by inserting $C_1$ into $N_2$, as shown in dashed lines in FIG. 2a, it is possible to extend the unity gain frequency of the error amplifier bringing it from the initial value $f_{T0}(A_3)=f_C(A_1)$ with $C_1=0$, to the value $f_{T1}(A_3) \approx p_2/2\pi$ if $p_2 < f_T(A_1)$ or $f_{T2}(A_3) \approx f_T(A_1)$ if $p_2 > f_T(A_1)$.

The circuit balance condition given by equation (10), assuming that $A_4$ has such a passband that $p_4 >> A_{10} \cdot p_1$ (preferably $p_4 > 5 \cdot A_{10} \cdot p_1$), consequently changes giving as result $$A_2 = A_1N_2 = \frac{1}{[1+s/(A_{10}p_1)]} \quad (14)$$

implying a different value for $C_n$ in FIG. 2a with respect to the situation wherein $C_1=0$.

By way of example, considering the case where $A_1$ is a medium power video amplifier, with $A_{10}=10$ and $f_C(A_1)=10$ MHz, having a dominant pole $p_1=2\pi 10$ MHz and a second pole $p_2=5 \cdot p_1$, according to what illustrated above, it is possible to use a phase lead in $N_2$ and to implement a correction loop with $f_T(A3) \approx p_2/2\pi=50$ MHz, thus capable to ensure a correction factor of about 34 dB at 1 MHz.

Still by way of example, considering the case where $A_1$ is a power audio amplifier with $A_{10}=30$ and $f_C(A_1)=0.3$ MHz, having one single dominant pole up to its $f_T(A_1)=9$ MHz, it is possible to use, through a proper phase lead in $N_2$, a correction loop with $f_T(A_3) \approx f_T(A_1) \approx 9$ MHz, thus capable to offer a correction factor larger than 40 dB up to 100 kHz, with one single correction loop, and of 80 dB up to 100 kHz with two correction loops. Therefore, if $A_1$ has an initial harmonic distortion equal to $THD(A_1)_{IN}=0.1\%$, through the error correction technique used in the present invention it is theoretically possible to obtain a distortion value equal to $THD(A_1)_{2AC} < 0.001\%$ with one single correction loop, and equal to $THD(A_1)_{2AC} < 0.00001\%$ with two correction loops.

Figure 2C:
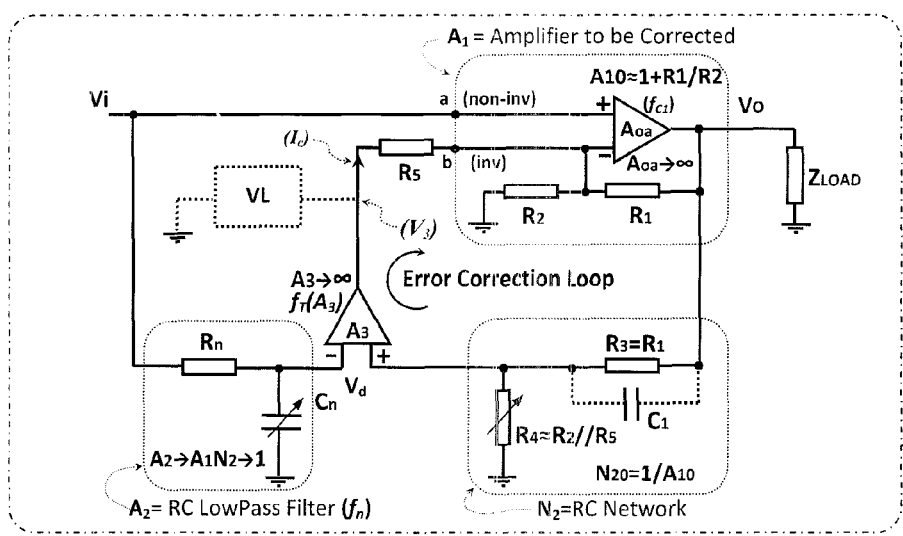

FIG. 2c shows a circuit block diagram of a third application of the device of FIG. 1a that illustrates as an application similar to that of FIG. 2a can be implemented in a very simple way in the case where the amplifier $A_1$ offers accessibility, besides to its non-inverting input, also to the inverting one, respectively indicated with a(non-inv) and b(inv) in FIG. 2c. In such case, it is possible to use the inverting input b(inv) as adder and to inject into it, through the resistor $R_5$, the correction current $I_C=(V_3-V_i)/R_5$. Given the sign reversal inside the correction loop associated with such solution, the inverting and non-inverting inputs of $A_3$ must be exchanged with each other, as shown in the same FIG. 2c.

The circuit diagram of FIG. 2c offers the advantage of allowing the elimination of the block $N_1$, that is in general not necessary anymore because the input impedance of $A_1$ is not substantially modified by the presence of the correction loop. However, it has the drawback of not allowing a direct reiteration of the correction mechanism, as shown in FIG. 1b, since it is not available for the second loop a distinct node thereof for injecting the correction voltage or current.

Figure 3:
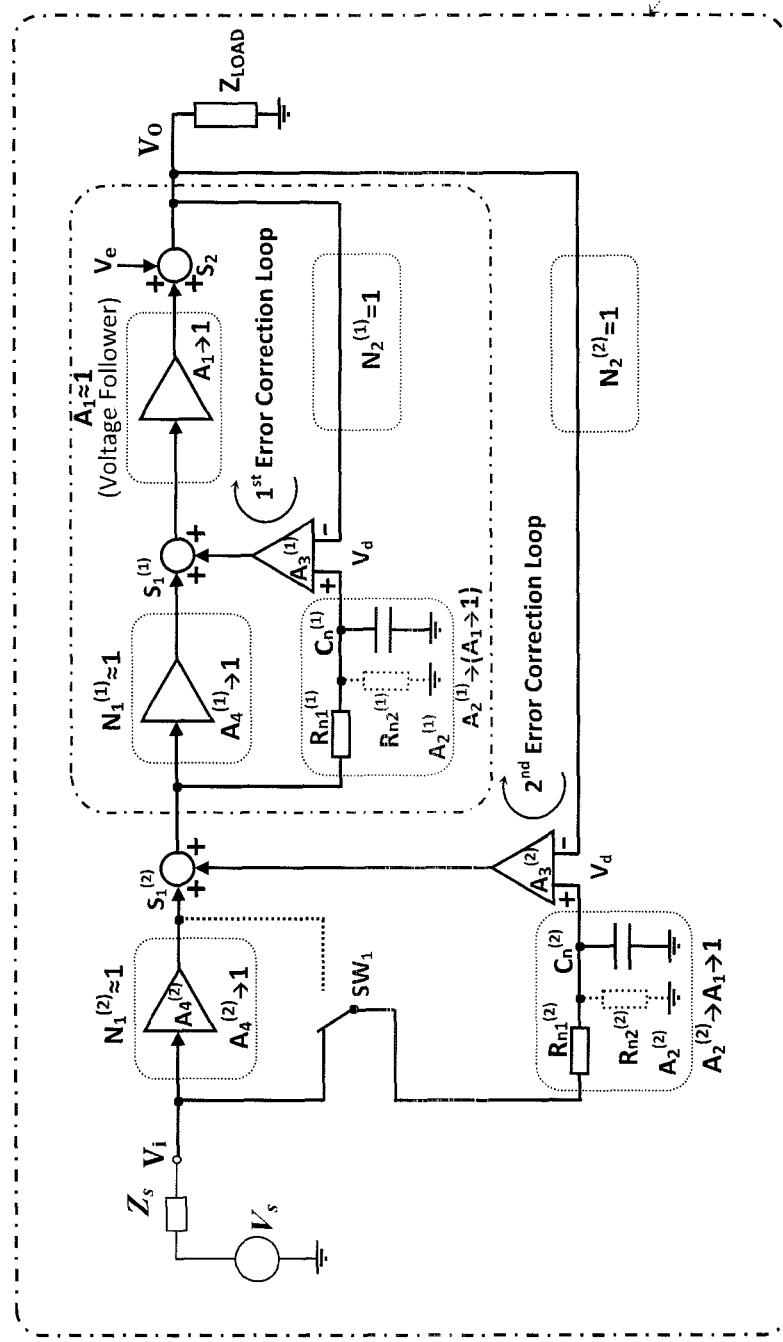
FIG. 3 shows a circuit block diagram of a first application of the device of FIG. 1b.

FIG. 3 shows a circuit block diagram of a first preferred application of the device of FIG. 1b, wherein the target amplifier $A_1$ to correct is a power voltage follower, preferably an open-loop power voltage follower, generally implemented with bipolar and/or MOSFET devices. Although the amplifier $A_1$ has usually a nominal unity gain, in the following description of FIG. 3 it is assumed the most general case of a gain value $A_{10}$ ranging from 0 to 1.5 (i.e. $0 < A_{10} < 1.5$), preferably ranging from 0 to 1 including 1 ($0 < A_{10} \le 1$), more preferably ranging from 0.5 to 1 including 0.5 and 1 ($0.55 \le A_{10} \le 1$), still more preferably ranging from 0.8 to 1 including 0.8 and 1 ($0.8 \le A_{10} \le 1$); it is clear that the desired DC gain $A_{10}$ is closer to the value 1. By way of example, $A_1$ can be the output stage of an audio or video operational amplifier, preferably a monolithic one (i.e. made through integrated circuit). In this type of applications it is usually sufficient the use of a single correction loop since the output stage in integrated circuits has bandwidths $f_C(A_1)$ of the order of tens of MHz in the audio case and even of hundreds of MHz in the video case. Since also $f_T(A_3)$ can assume values close to $f_C(A_1)$, it is therefore possible to obtain with a single correction loop a ratio $\rho$ of distortion reduction larger than 40 dB from DC up to more than 100 kHz, in audio amplifiers, and larger than 20 dB from DC up to more than 10 MHz, in video amplifiers. However, in FIG. 3 the error correction scheme is reiterated twice in cascade around $A_1$ in order to obtain a power voltage follower with minimum values of error and both harmonic and intermodulation distortion. Therefore, such double correction loop scheme is particularly adapted to implement Unity gain Power Modules (integrated or discrete ones) with very high input impedance, high precision and accuracy levels (extremely low noise and offset voltages) and very low harmonic and intermodulation distortions (THD<0.0001%). The switch $SW_1$ serves to qualitatively indicate the possibility to use the unity gain module $A_4^{(2)}$ for improving the impedance separation from the source of the signal $V_S$, most of all in the case where the values of source impedance $Z_S$ are rather high, by connecting downstream of $A_4^{(2)}$ the RC block for balancing $A_2^{(2)}$ that has in general a decreasing impedance with the frequency and that could unacceptably interact with $Z_S$ thus altering the frequency and time response of the whole device. In this case, the module $A_4^{(2)}$ is outside both correction loops and, therefore, it must satisfy linearity and precision requirements stricter than the case of FIG. 1b, wherein instead it is inside the second correction loop and thus enjoy the correction benefits associated thereto (this circuit arrangement can be also considered as a case wherein $N_1$ is a direct short-circuit connection and the source of the signal $V_S$ is separated from the external loop through the unity gain module $A_4^{(2)}$ operating as an impedance separator).

The power voltage follower $A_1$ is typically characterized by a frequency response of low-pass type with few poles (preferably one or two poles) and with nominal gain tending to unity, i.e. $A_{10} \to 1$, and having cutoff frequency at −3 dB always equal to $f_{C1}$ and usually higher than 10 MHz. Obviously it is a particular case of the first preferred application, wherein $N_1$ is still constituted by a voltage follower with unity transfer function, i.e. $A_4 \to 1$, and having cutoff frequency at −3 dB equal to $f_{C4}$, and preferably such that $f_{C4} \gg f_{C1}$ (preferably $f_{C4} > 5 \cdot f_{C1}$), and wherein also the block $N_2$ has unity transfer function, i.e. $N_2 = 1$, and therefore it is constituted by a simple short-circuit connection. The block $A_2$ may perform the necessary balancing, expressed by equation (4), in each one of the two correction loops, with a transfer function equal (by neglecting for the sake of simplicity the superscripts (1) and (2)) to $A_2 = A_1 N_1 N_2 = A_1 N_1$; also in this case, what above is possible with a simple passive low-pass filter RLC, with multiple real or complex conjugate poles, and in many practical cases, such as for instance with MOSFET voltage followers, with one single real pole as shown in FIG. 3. In the most general case, $A_2$ should have a DC gain $A_{20}$ equal to $A_{20} = A_{10} < 1$ for ensuring the best balance; however, such gain can assume unity value, i.e. $A_{20} = 1$, without significant drawbacks under the condition that particularly $A_3^{(1)}$ has sufficient output dynamics for being capable to adequately manage also the rather high linear errors (lack of gain with respect to the ideal case of $A_{10} = 1$, and offset voltage) of $A_1$, errors which are as much higher as larger the deviation of the gain $A_1$ from the nominal value and as higher its offset voltage. The DC balance can in any case be performed, if needed, by assigning a proper value to the optional resistors $R_{n2}^{(1)}$ and $R_{n2}^{(2)}$ (indicated in dashed lines in FIG. 3), such that $A_{20} = A_{10}$.

In the particular case of the voltage follower of FIG. 3, that is desired to have optimal output offset performance and gain tending to unity in a wide band, it is necessary to correct also both DC and AC linear errors in the useful band, whereby in the scheme of FIG. 3 the resistors $R_{n2}^{(1)}$ and $R_{n2}^{(2)}$ have preferably infinite value and they are not inserted into the scheme. The best way to satisfy such requirements without excessive complications is offered by the flexibility of the scheme that allows to assign different and partly supplementary tasks to the two correction loops, for instance in the following way:

the first loop (i.e. the inner one) has a output dynamics of $A_3^{(1)}$ that is sufficiently wide to be capable to correct also the linear errors, in particular the output offset voltage and the low gain of $A_1$ in the signal useful band, but is appropriate and/or necessary it operates in a more limited frequency range with respect to the maximum potential, i.e. with ratio $R^{(1)} = f_T(A_3)/f_C(A_1) < R^{(1)}_{OPT}$; in this case the resistor $R_{n2}^{(1)}$ can assume infinite value and the corrected amplifier $A_1$ will tend to have null output offset and unity gain, i.e. $A_{10C} \approx 1$, from DC up to about the frequency $f_1 = R^{(1)} f_C(A_1)$;

the second loop (i.e. the outer one) operates in the whole allowed frequency range, i.e. with $R^{(2)} \to R^{(2)}_{OPT}$, but it has requirements of reduced output dynamics of $A_3$ with respect to the first loop, since it has to manage only the residual error that is not corrected by the first loop; such residue, containing linear and non-linear components all of lower order than those of the first correction loop, is very small in percentage with respect to the useful signal and generally not larger than 1%, whereby a great dynamics of $A_3^{(2)}$ is not necessary; since $A_{10C} = 1$, also $A_{20}^{(2)}$ assumes unity value and thus $R_{n2}^{(2)}$, also of infinite value, is excluded.

The formulas discussed for the application of FIG. 2a continue to be valid by inserting therein the values related to the present case, i.e. $A_{10} = 1$ and $N_2 = 1$. With regard to the correction potential, $\rho_a(f)$, of each correction loop of FIG. 3 at the frequency f, it can be determined by considering as reference the situation wherein both $A_3^{(1)}$ and $A_3^{(2)}$ have a constant gain-bandwidth product up to their unity gain frequency, whereby it is possible to assume $f_T(A_3^{(1)}) \approx f_T(A_3^{(2)}) \approx f_{c1}$ still meeting the Bode stability criteria and thus ensuring adequate stability margins to both the correction loops. In such situation the correction potential of each one of the two loops, when $f > f_{c1}$, can be defined as $$\rho_a(f) \approx f_{c1}/f \qquad (15)$$

and hence the total correction potential of the two loops, $\rho_T(f)$, given by their product, is equal to $$\rho_T(f) \approx (f_{c1}/f)^2 \qquad (16)$$

By way of example, with $f_T(A_3) \approx f_{c1} = 10$ MHz, at 100 kHz it is $\rho_a(100 \text{ kHz}) = 100$ (i.e. 40 dB) and $\rho_T(100 \text{ kHz}) = 10000$ (80 dB). If the harmonic distortion of $A_1$ at 20 kHz is for instance equal to THD=0.5% (including harmonics up to 100 kHz), with a single correction loop it is possible to reduce the distortion down to THD(1)<0.005%, and with two loops down to THD(2)<0.00005%.

FIG. 4 shows a comparison of the performance obtainable with the device of FIG. 1b, wherein the innovative error correction technique according to the present invention is applied to a voltage follower using a complementary pair of power MOSFETs according to the scheme of FIG. 3, with the performance obtainable by applying the aforementioned AEF technique to the same voltage follower. In particular, since the previously illustrated prior art error correction techniques are commonly used for reducing the distortion of the output stages of class-AB power amplifiers, which are typically constituted by voltage followers, performance simulated with the XSPICE simulation engine by Multisim of the prior art correction schemes and scheme on which the device according to the invention is based are compared, for demonstrating the novelty and the advantageous technical effects of the latter.

Figure 4A:
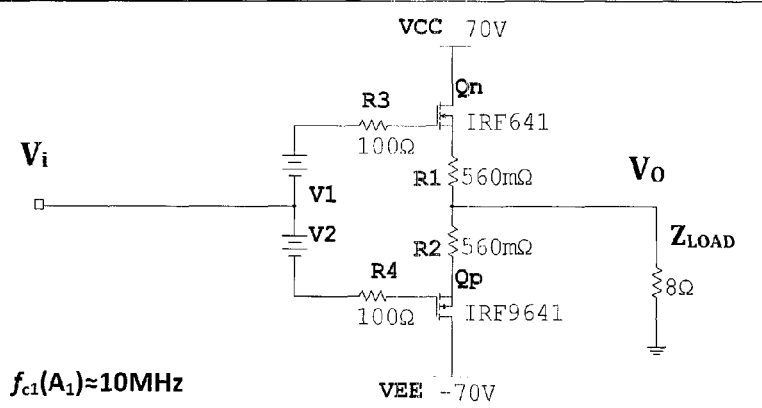
FIG. 4 shows a comparison between two amplifier apparatuses according to the prior art and the device of FIG. 1b and between the related performance.
Figure 4A:
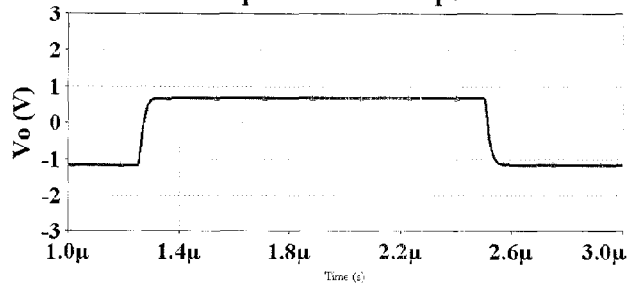
Figure 4A:
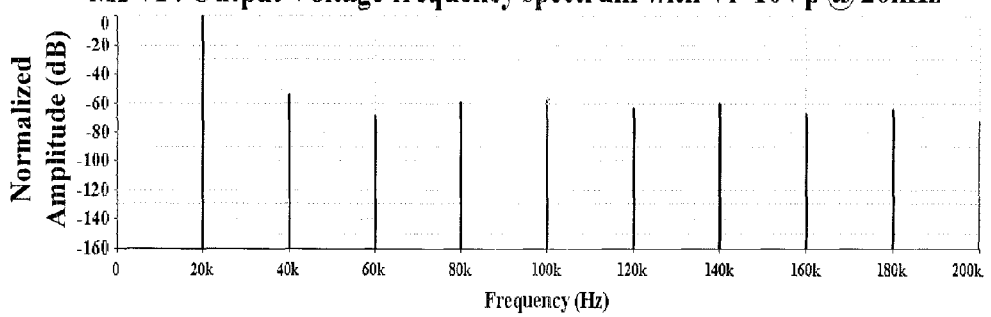

FIG. 4a(1) shows the scheme of a MOSFET power voltage follower (MPVF) constituted by a pair of complementary power MOSFET devices, one with N-channel and another with P-channel, and made with commercial devices IRF641 and IRF9640. The follower is biased through two DC voltage generators $V_1$ and $V_2$ with a drain current of about 100 mA and it supplies the load $Z_{load}$ of 8 Ohm. The two biasing voltage generators $V_1$ and $V_2$ are assumed equal to each other for the sake of ease and they operate also as level shifters. The cutoff frequency $f_{C1}(A_1)$ at the simulator is about 10 MHz. FIG. 4a(2) shows the simulated response to a square wave of 1 volt peak, whereas FIG. 4a(3) shows the output spectrum corresponding to a sinusoidal input of 10 Volt peak at 20 kHz. The related harmonic distortion, considering all the harmonics of the fundamental up to 200 kHz is equal to $THD_{A1}=0.25\%$.

Figure 4B:
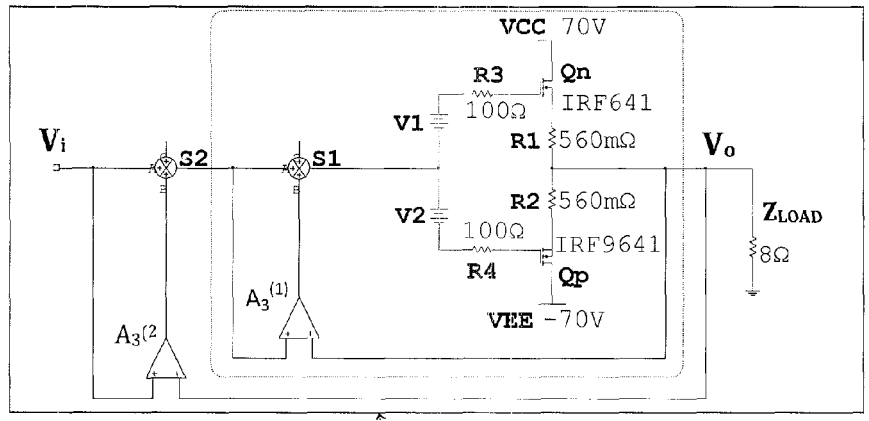
Figure 4B:
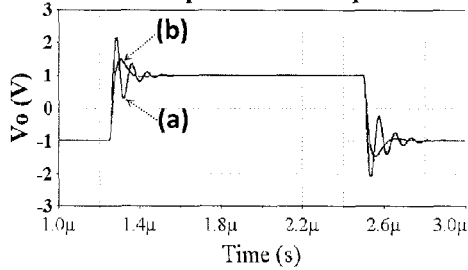
Figure 4B:
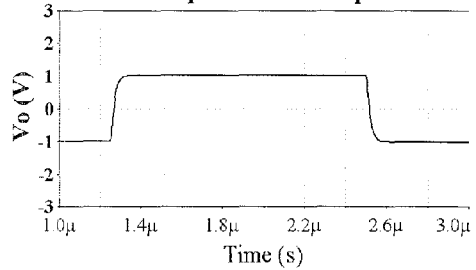
Figure 4B:
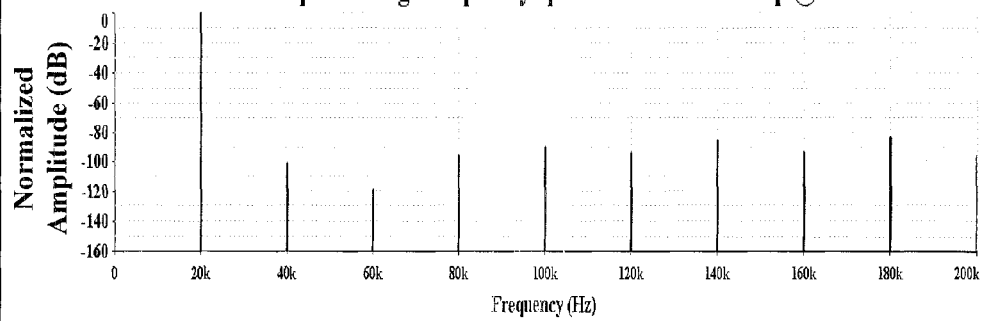

FIG. 4b(1) shows the simplified scheme of the prior art active negative feedback error correction disclosed by J. R. Macdonald in "*Active-Error Feedback and its Application to a Specific Driver Circuit*", Proc. IRE, vol. 43, pp. 808-813, July 1955, applied, for illustrative purposes, with double iteration and equivalent to the scheme of FIG. 1b with $N_1=1$ and $A_2=1$. Both the correction loops can operate with $R=Ropt=1$ and hence with $f_T(A_3)=f_{C1}(A_1)=10$ MHz and they can maintain good dynamic stability margins. However, from the point of view of the useful signal, the device response to the corresponding square wave, reported in FIG. 4b(2), shows the significant differences with respect to the original response of $A_1$ and highlights the evident limits of dynamic stability of such scheme, not only when $f_T(A_3)=10$ MHz, curve (a), but also when $f_T(A_3)=3$ MHz, curve (b). In order to be capable to obtain from such scheme stability margins similar to those of $A_1$ and hence a response to the signal $V_i$ similar to that in FIG. 4a(2), it is necessary to significantly reduce $f_T(A_3)$, down to the value $f_T(A_3)=0.06\,f_{c1}(A_1)=0.6$ MHz, i.e. down to 6% of the passband of $A_1$. The response in these conditions, reported in FIG. 4b(3), is rather similar to that of FIG. 4a(2), although the settling times are much longer. However, in these conditions, the correction potential of the scheme of FIG. 4b(1) is obviously much reduced with respect to the theoretical one and it is equal to $\rho_{MC}(f)=(600/f)^2$ (with f expressed in kHz), i.e. equal to 36 (31 dB) at 100 kHz and to 9 (19 dB) at 200 kHz. The output spectrum corresponding to a sinusoidal input of 10 Volt peak at 20 kHz, reported in FIG. 4b(4), shows a harmonic distortion $THD_{MC}=0.0100\%$, about 28 dB lower than that of $A_1$ in FIG. 4a(3) and in line with the values of $\rho_{MC}$.

Figure 4C:
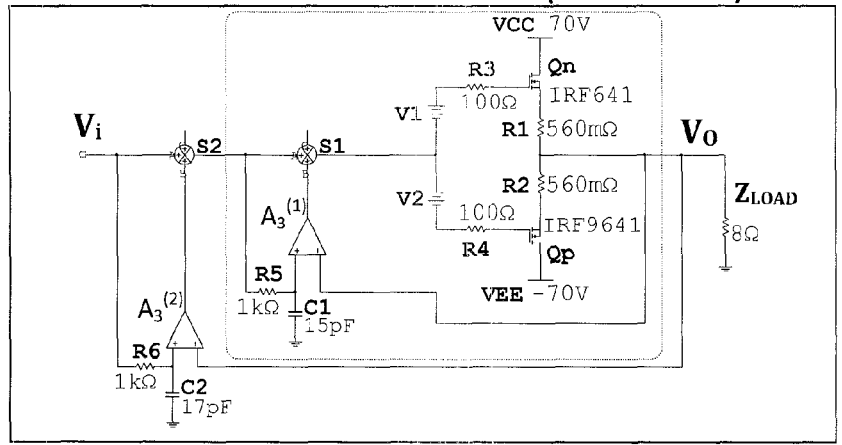
Figure 4C:
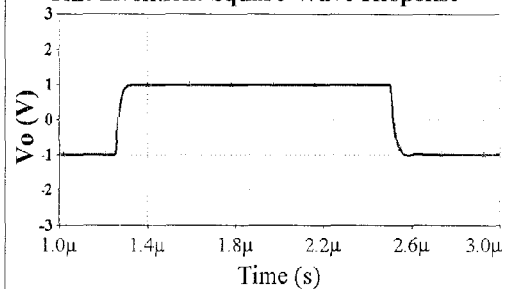
Figure 4C:
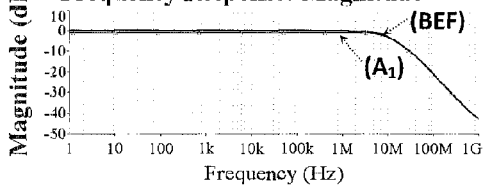
Figure 4C:
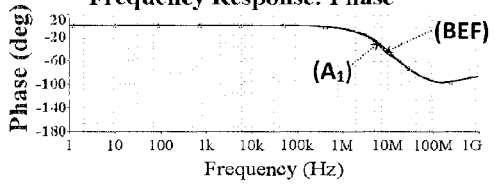
Figure 4C:
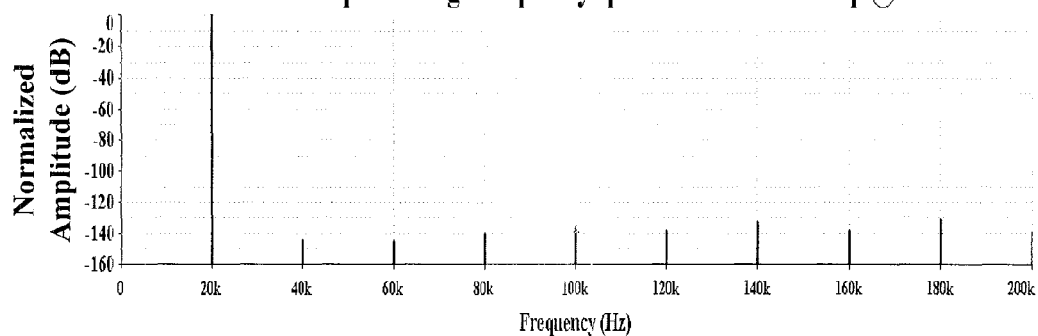

FIG. 4c(1) shows a simplified scheme of the device of FIG. 1b based on the error correction technique according to the present invention, with $N_1=1$. Once that a sufficient balance with the two blocks $A_2^{(1)}$ and $A_2^{(2)}$ has been made, through the two RC networks constituted by R5-C1 and R6-C2, it is not only possible to use values of $f_T(A_3)=f_{c1}(A_1)=10$ MHz without altering the response of $A_1$ to the square wave, but it is even possible to significantly exceed $f_{c1}(A_1)$ without altering such response and without causing serious stability problems to the correction loops. In any case, by conservatively assuming $R=R_{opt}=1$, i.e. $f_T(A_3)=f_{c1}(A_1)=10$ MHz, the corresponding correction potential of the new scheme with double loop is equal to $\rho_{NS}(f)=(10000/f)^2$ (with f still expressed in kHz), and therefore at 100 kHz $\rho_{NS}$ is larger than that, $\rho_{MC}$, offered by the scheme of FIG. 4c(1) by $(10000/600)^2=277$ (49 dB) times. FIG. 4c(2) shows the simulated response to the square wave that is practically the same of $A_1$ shown in FIG. 4a(2), apart from the absence of the original offset voltage, eliminated as foreseen by the correction loops. FIG. 4c(3) shows together in the same diagram the frequency responses (magnitude and phase) of both the circuit of FIG. 4a(1) and the circuit of FIG. 4c(1): the two responses are practically superimposed, in magnitude and phase, from DC up to more than 1 GHz, and small differences can be noted, as expected, only in proximity of $f_{C1}(A_1)$. Finally, FIG. 4c(4) shows the output spectrum corresponding to the usual sinusoidal input with 10 Volt peak at 20 kHz. It is possible to observe the significant result that here all the harmonics up to 200 kHz are lower than the level of −130 dB with respect to the fundamental and the corresponding harmonic distortion, $THD_{NS}<0.00005\%$, is lower by 200 times (46 dB) with respect to that reported in FIG. 4b(4) and related to the circuit of FIG. 4b(1).

Figure 5:
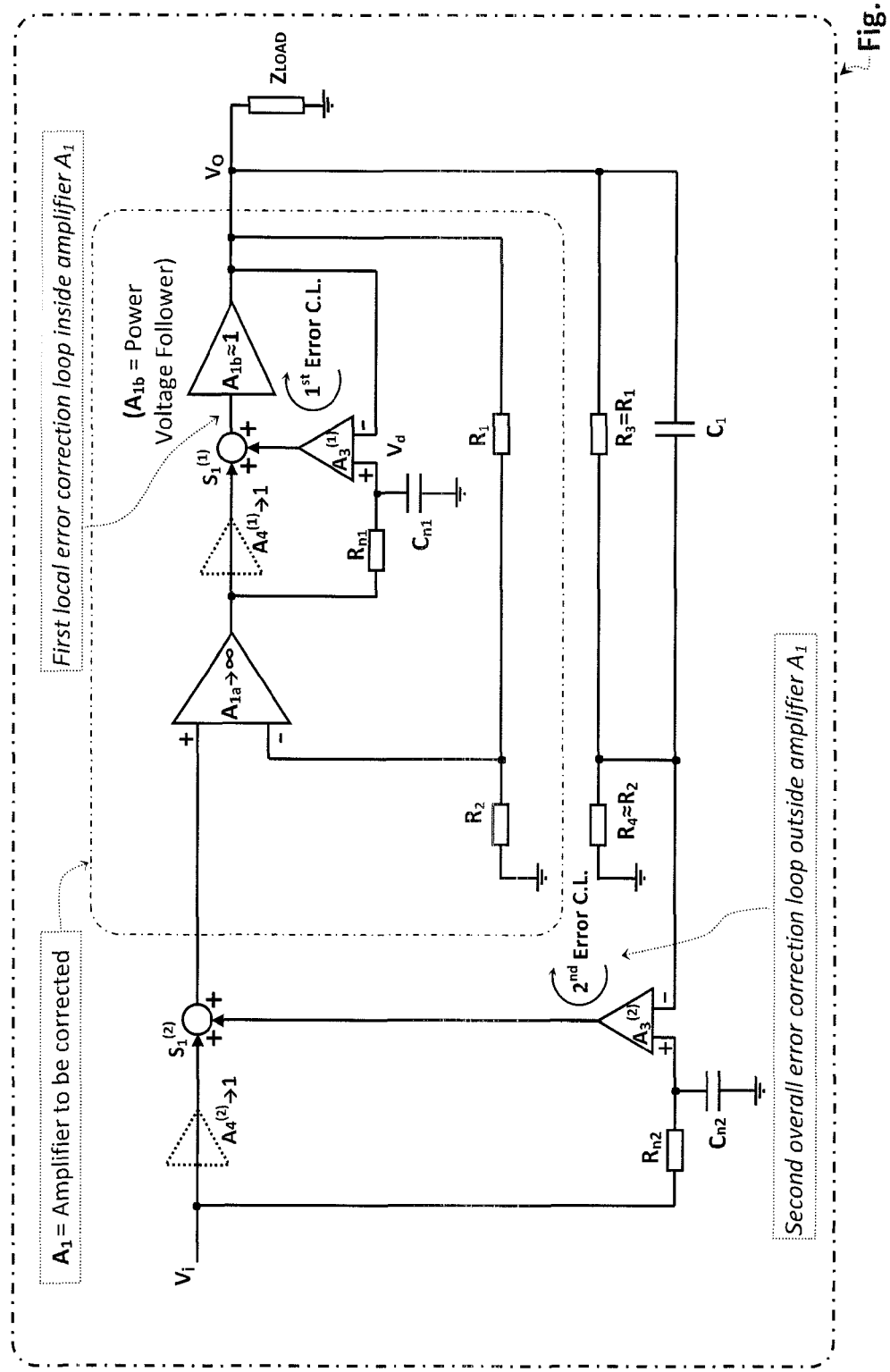
FIG. 5 shows a circuit block diagram of a second application of the device of FIG. 1b.

FIG. 5 shows a circuit block diagram of a second application of the device of FIG. 1b, that synergically uses two correction loops. In such scheme, the first correction loop (similar to that described in FIG. 3) is used for correcting the output stage of the amplifier $A_1$, constituted by a power voltage follower, whereas the second correction loop (similar to that described in FIG. 2a) is used outside $A_1$ for correcting the residual error of the complete amplifier $A_1$ which furthermore has its own negative feedback loop through the resistor network R1-R2. The voltage follower block $A_4^{(1)}$ (indicated in dashed lines in FIG. 5) is optional, because it can be omitted when the block $A_{1a}$, that synthetically represents all the stages preceding the output stage of $A_1$, has sufficiently low output impedance and adequate current availability; in the contrary case, i.e. when the block $A_{1a}$ has an insufficient current availability and/or high impedance output, the voltage follower block $A_4^{(1)}$ must be inserted.

The application of FIG. 5 with double error correction loop is particularly indicated for making audio amplifiers with very high performance, in terms both of musical transparency (very wide power band, high dynamics in all the stages, very high slew-rate, low overall negative feedback ratios, etc.) and of harmonic and intermodulation distortion (lower than 0.0001%). The reason is most of all based on the fact that the inner correction loop operates with the wide bandwidth $f_C(A_{1b})$ of the power voltage follower, as stated of the order of tens of MHz and much larger than the cutoff frequency $f_C(A_1)$ of $A_1$, that usually has high gain, typically ranging from 20 dB to 40 dB, and generally unity gain frequency $f_T(A_1)$ lower than $f_C(A_{1b})$.

This allows to obtain a series of advantages. First of all, as already described with reference to the scheme of FIG. 3, it is possible to obtain already with only one correction loop operating with bands of 10 MHz and more very high error correction rates, of the order of 40 dB at 100 kHz, and hence it is possible to reduce the high error levels typically associated to the output power stage down to adequately low values. Also, thanks to the high gains of $A_1$ and to the fact that, since $f_T(A_1)$ is lower than $f_C(A_{1b})$, the most critical frequency range of the inner correction loop is in a zone wherein $A_1(f)$ is very low or even lower than 1, the effects of the interaction of the inner correction loop with the frequency response of $A_1$ are very reduced also in case of non-perfect balance due, for instance, to the greater complexity of the output stage; therefore, the reiteration of the error correction mechanism with the second outer correction loop is facilitated and the latter can be thus more easily optimized without critical interactions with the inner correction loop. Finally, thanks to the high DC gain $A_{10}$ of the amplifier $A_1$, it is possible to best use the phase lead in the block $N_2^{(2)}$ through the capacitor C1, as described with reference to the scheme of FIG. 2a, for extending the $f_T(A_3^{(2)})$ and improving the correction rate of the second loop at high frequencies.

Figure 6:
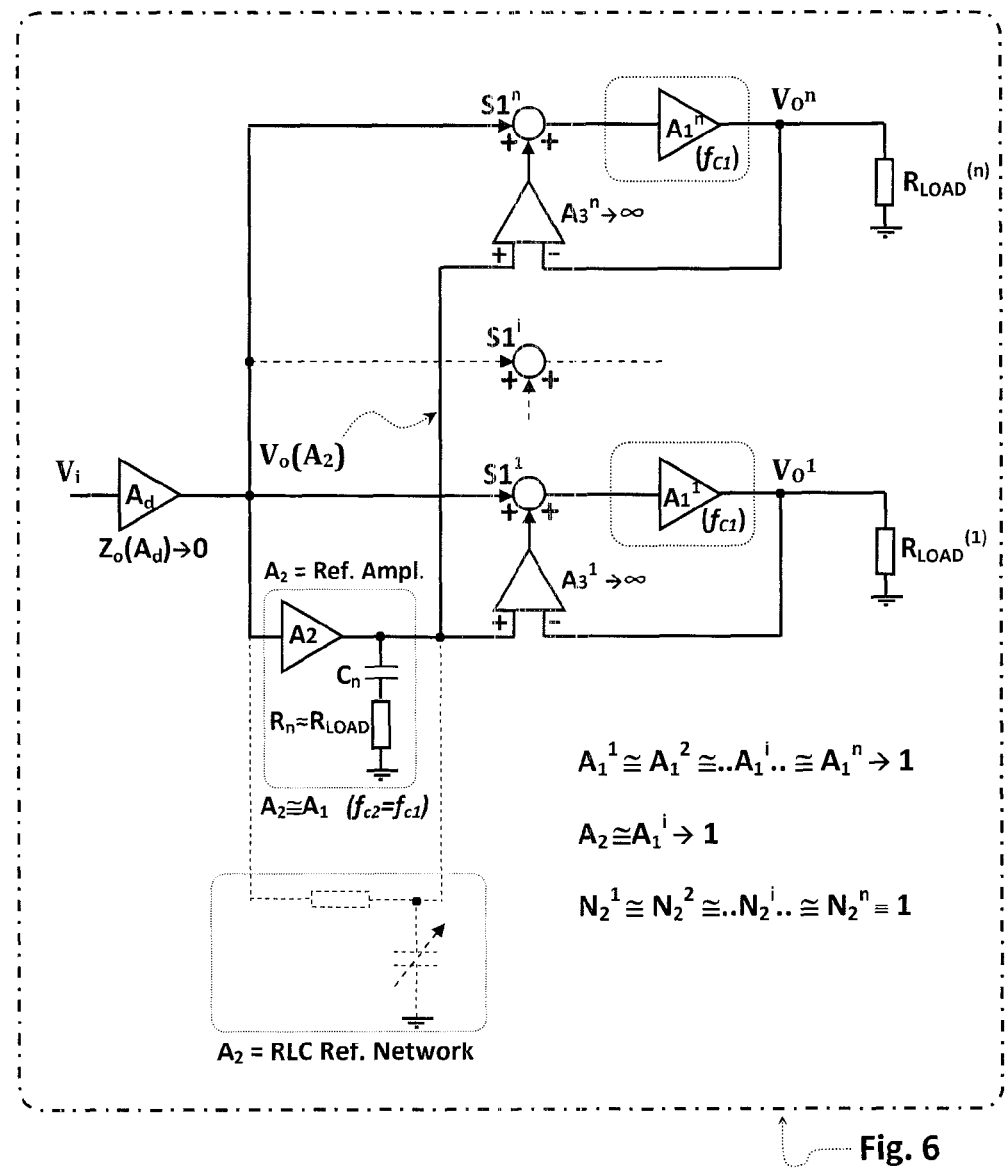
FIG. 6 shows a circuit block diagram of a third embodiment of the amplifier device according to the invention.

FIG. 6 shows a circuit block diagram of a third embodiment of the amplifier device according to the invention, wherein a unique balancing active block $A_2$ is used for the error correction of an array of n amplifiers $A_1^1$ - - - $A_1^n$ all equal to each other (within the limits of the usual manufacturing tolerances) and having nominal unity gain, i.e. $A_1^1=A_1^i=$ - - - = $A_1^n \rightarrow 1$. Each amplifier of the array $A_1^1$ - - - $A_1^n$ has its own correction loop with respective blocks $N_1=N_2=1$, whereas, as stated above, the unique balancing/reference block $A_2$ is shared by all the amplifiers of the array $A_1^1$ - - - $A_1^n$, thus generalizing the scheme of FIG. 1a. The common balancing block $A_2$ can be constituted, similarly to what previously described, by a RLC/RC passive network, as represented in FIG. 6 by the block $A_2$=RLC Network indicated with dashed lines; however, in the scheme of FIG. 6 the common balancing block $A_2$ is preferably constituted by an amplifier identical, at circuit level, to the amplifiers to correct, i.e. such that $A_2 \equiv A_1^i$, so that the balance condition expressed by equation (4) is optimally satisfied and the time-frequency response of the various channels is identical to the one of the single amplifier $A_1$ at all the frequencies and at all the levels of the input voltage.

The effectiveness of such scheme is greater when the amplifiers used for implementing the same are part of the same integrated circuit and they are well coupled (as for instance in case of integrated circuits with quadruple operational amplifiers). Since the balancing/reference network is the same for all the error correction loops, the output voltage $V_O^i$ of the i-th amplifier, thanks to the action of its own correction loop, is equal to the output voltage of the reference amplifier, and thus it is $$V_O^1 = V_O^2 = \cdots = V_O^n \cong V_O(A_2)$$

The input block $A_d$ has the dual purpose of amplifying, if necessary, the input signal $V_i$, and the more important one of impedance separator between the input voltage source and the correction loops of the single amplifier channels of the array. The scheme of FIG. 6 is particularly appropriate for correction and accurate distribution of audio/video signals on n amplified channels with a high "matching" of amplitude and phase among the channels, even in presence of load variations of each amplifier channel with respect to the nominal value $R_{LOAD}$. It should be noted that the load of the reference amplifier $A_2$ is constituted by the capacitor Cn in series to the nominal load $Rn = R_{LOAD}$, the values of which are properly defined so that $f_{CN} = 1/2\pi CnRn \approx f_{C1}$ (i.e. equal to the cutoff frequency at −3 dB of the amplifiers $A_1^1 \cdots A_1^n$ of the array). In this way $A_2$ sees an output impedance much larger than $R_{LOAD}$ in the band of the useful signal, i.e. for $f < f_{C1}$, and a load equal to about $R_{LOAD}$ beyond the useful band, i.e. for $f > f_{C1}$. This arrangement allows, on the one hand, to obtain an optimal balance, i.e. the fulfillment of the equation (4), in the most critical frequency zone, i.e. for $f \geq f_{C1}$, and to keep therefore the transfer function $V_o^i/V_i$ of each amplifier channel of the array unaltered, and, on the other hand, by making $A_2$ operate with high load impedances for $f < f_{C1}$, to minimize the distortion of $A_2$, and hence of all the channels, in the whole useful band.

In the Figures described so far, and in the related discussions, for the sake of greater clarity, only the most significant details have been highlighted of the functional blocks, both from the functional point of view and from the design/implementation point of view, the specific implementation of which depends on the specific context of the application under consideration.

In the following of the present specification, reference is made to specific preferred implementation solutions of the blocks $N_1$, $S_1$ and $A_3$ and optional blocks $N_3$ and VL, which allow to adequately and inexpensively satisfy all the requirements of such blocks within the amplifier device according to the invention with very low distortion values, and at the same time to effectively solve the associated problems, so as to permit in the preferred applications a full use of the potential of the innovative error correction technique used by the invention and to steadily obtain extremely low levels of error and distortion.

Preferably, the implementation solutions illustrated in the following have the adder S1 that is absolutely transparent to the transit of the useful signal and that at the same time allows the addition of the correction signal, on the one hand, without interferences with the useful signal and, on the other hand, without deteriorating the correction potential of the correction loop, i.e. without introducing excessive error contributions or reducing the useful frequency band. The circuit implementing $S_1$ has therefore very wide bandwidth in both directions, i.e. useful signal $V_i$ and correction voltage $V_C$, in any case adequately larger than the optimal value of $f_T(A_3)$. Moreover, the adder S1 illustrated in the following has its own error contribution that is very low, and hence, more in particular, low noise and low distortion, low offset voltage and it has also a voltage and current dynamics that is adequate to the particular context wherein it operates. Advantageously, the implementation of the adder S1 is preferably also simple and inexpensive.

With regard to the error amplifier $A_3$, in the implementation solutions illustrated in the following it has very high gain, preferably larger than 100 (i.e. larger than 40 dB), and moreover it has the necessary output dynamics, of both voltage and current, in every operative conditions, high precision, low noise and low distortion, high "slew-rate" and large power bandwidth, and wide frequency band with the possibility to adjust in a simple way its unity gain frequency $f_T(A_3)$ for optimizing the performance of the correction loop. In some contexts, such as for instance the one of FIG. 3 or FIG. 5, wherein the error amplifier $A_3^{(1)}$ corrects high power voltage followers, the dynamics and "slew rate" requirements become particularly strict. In fact, $A_3$ has to deal with correction voltages and currents superimposed to particularly high voltages at the input and output of $A_1$, and with speed (i.e. derivative of the voltage $dV/dt$) of $A_1$ generally also very high.

FIG. 7 shows the schematic circuit diagrams of some specific embodiments of some portions of the amplifier device according to the invention, in particular of the blocks $N_1$, $S_1$ and $A_3$ and optional blocks $N_3$ and VL of the correction loop which allow to fully exploit the correction potential of the innovative correction technique.

Figure 7A:
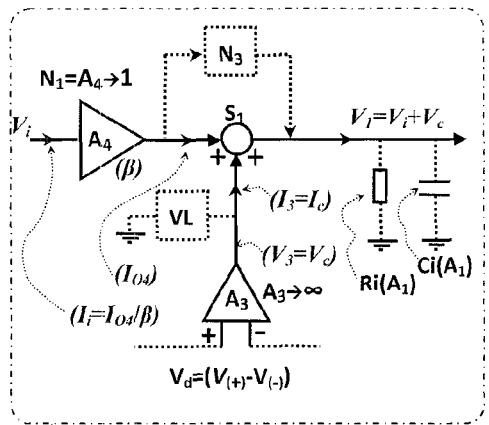
FIG. 7 shows the schematic circuit diagrams of some specific embodiments of some portions of the amplifier device according to the invention.

FIG. 7a shows the simplified scheme of the central portion of the preferred embodiment of the device according to the present invention, wherein the block $N_1$ is constituted by the voltage follower $A_4 \rightarrow 1$. In particular, the involved blocks, i.e. $N_1$, $S_1$, $A_3$ and VL and $N_3$, the quantities and electrical parameters of greatest interest for the step of implementing blocks with actual circuits are highlighted in FIG. 7a. In particular, these include the correction voltage and current, $V_3 = V_C$ and $I_3 = I_C$ respectively, at the output of $A_3$, the current $I_{O4}$ delivered by $A_4$, and the output voltage from the adder $S_1$ equal to $V_1 \approx V_i + V_C$. The current gain $\beta$ of $A_4$ is also highlighted, since it plays an important role in many applications, and the input impedance of $A_1$ schematically represented with the capacitor $Ci(A_1)$ and resistor $Ri(A_1)$, that constitutes another important parameter.

The subsequent five FIGS. 7b-7f show some specific preferred embodiments operating according to the functions described by the scheme of FIG. 7a. In all the solutions of FIGS. 7b-7f, the addition operation of the correction voltage to the useful signal is preferably carried out by directly inserting the voltage $V_C$ in series to the useful signal $V_i$. If the source $V_S$ of FIG. 1a has low internal impedance $Z_S$ and adequate current availability, the insertion of the voltage $V_C$ may be carried out in proximity to the same input of the device, and in such case the block $N_1$ is constituted by a simple direct short-circuit connection, but if the source $V_S$ has high internal impedance $Z_S$, the insertion of the voltage $V_C$ is carried out downstream of the voltage follower $A_4$ constituting the block $N_1$. The mechanism through which the operation is carried out is common to all the solutions illustrated in FIGS. 7b-7f and it is constituted, preferably but not necessarily, by a single resistor having properly low impedance, indicated with $R_7$, on which the correction current $I_C$ is injected with appropriate phase. It should be considered that the use of the resistor $R_7$ as adder element implies that the value of the resistor $R_7$ participates in defining the gain of the equivalent error amplifier $A_3$ to an extent depending on the specific circuit configuration; therefore, the resistor $R_7$ also operates as one of the components defining the gain of the equivalent error amplifier $A_3$. This technique allows to simply and inexpensively satisfy the requirements of the adder $S_1$ discussed above, i.e. high transparency to the passage of the useful signal, wide band, high dynamics and response speed in both directions, of both the signal $V_i$ and the correction voltage $V_C$, and low potential noise, function of the value of $R_7$, that can be defined depending on the specific needs of the application. In particular, the value of the resistance of R7 is preferably dimensioned so as not to produce poles lower than $f_c(A1)$ or $f_T(A3)$, and possibly decoupled from Vs and A1 through two respective voltage follower circuits. This also allows an easy bypass of the correction mechanism beyond the frequencies wherein the correction loop is no more operative. In such case $N_3$ is generally constituted by a capacitor C2 having a proper value in parallel to R7.

However, it should be noted that there exist problems associated to such mechanism, often underestimated and neglected in prior correction techniques with active error negative feedback, of which it is instead necessary to take account in most critical applications. A first problem consists in that the correction current $I_C=V_C/R_7$, in the cases where there are simultaneously high values of Vc and low values of $R_7$, can be very high and reach values of many tens of mA in conditions of substantially linear operation of $A_1$, and, if not properly limited, of some hundreds of mA during the periods of overload wherein $A_1$ operates in strongly nonlinear regime (for instance in case of saturation of the output voltage—also known with the term "clipping"—, current or slew-rate limitations). Another problem is constituted by the correction current $I_C=V_C/R_7$, containing both the fundamental component and the harmonics of the useful signal, that can overlap the normal driving current $I_d=V_i/Z_i(A_1)$, where $Z_i(A_1)$ is the input impedance of $A_1$ constituted by the parallel $Ci(A_1)//Ri(A_1)$, and that can produce at the input of the adder equivalent impedance values which are low, nonlinear and in some circumstances also negative. The solutions shown in FIGS. 7b-7f duly take account of these problems and include original and effective countermeasures for dealing with and overcoming them.

Figure 7B:
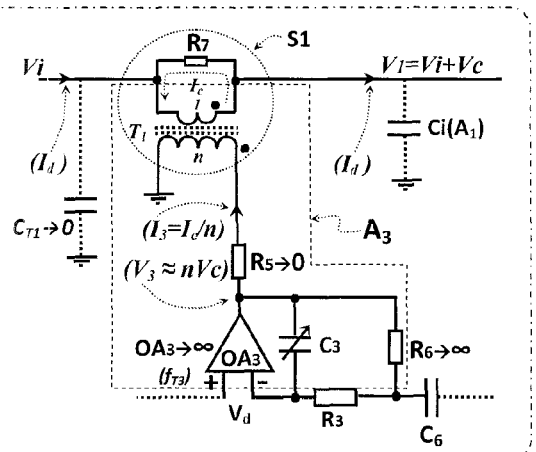

FIG. 7b shows the details of a first preferred implementation of the circuit scheme of the error correction portion of FIG. 7a, that is the least invasive with respect to the signal path and particularly appropriate for AC high power amplifier systems requiring particularly high dynamics of the error correction voltage. The limited invasivity on the signal path is first due to the fact that it is a galvanically isolated adder of balanced type, since the correction current $I_C=V_C/R_7$ is input at a terminal of $R_7$, that has a preferably very low value, more preferably ranging from some Ohms to few tens of Ohms, and it is reabsorbed with identically equal value from its other terminal, through the wide band transformer $T_1$ that has the secondary winding exclusively dedicated to such purpose. Therefore, the correction current $I_C$ is confined only within the loop constituted by the secondary winding of $T_1$ and resistor $R_7$, whereby the problems associated therewith and mentioned above are completely eliminated. Consequently, the current $I_d$ of the branch carrying the useful signal is not at all affected by the correction process, and consequently the block $N_1$ of the block diagram of FIG. 7a is no more necessary and hence can be omitted and replaced with a direct short-circuit connection, as shown in FIG. 7b. Also, $T_1$ has a low capacitance $C_{T1}$ between its winding turns and towards ground, so as not to alter the passband of the passing signal $V_i$ thus ensuring the maximum transparency of the amplifier. $T_1$ has a core preferably made of ferrite for obtaining very wide frequency bands and a turns ratio n:1 so as to advantageously allow very low values of $R_7$ besides an optimal coupling to the amplifier $OA_3$ and to its output dynamics, thanks to the characteristic relationship established by $T_1$ between the voltage $V_3 \approx nVc$ and the current $I_3=I_C/n$. The turns ratio n can be also used for simply limiting the maximum correction voltage across $R_7$ to the value $V_{C(MAX)}=V_{3(MAX)}/n$ where $V_{3(MAX)}$ is the maximum output voltage of $OA_3$, normally very close to the supply voltage. The amplifier $OA_3$ is preferably constituted by a simple operational amplifier with characteristics of gain, band, precision and speed which are adequate to the specific application. It should be noted that the error amplifier gain is affected by the turns ratio and is equal to $A_3=V_c/V_d=OA_3/n$ and the adjustment of the unity gain frequency $f_T(A_3)$, necessary for optimizing the performance of the correction loop, is carried out in the scheme of FIG. 7b through the components $C_3$ and $R_3$ and brought to its optimal value $f_{TO}(A_3)=1/[2\pi n R_3 C_3]$ by assigning a proper value to $C_3$ (and/or to $R_3$). For the adjustment to correctly operate it is obviously necessary that $OA_3$ has its own unity gain frequency $f_T(OA_3)$ larger than such frequency, i.e. $f_T(OA_3)/n > f_{TO}(A_3)$. The use of the transformer $T_1$ has another significant advantage constituted by the galvanic decoupling between its winding turns isolating $V_3=nV_C$, present at the primary winding, from the signal voltage $V_i$, present at the secondary winding, significantly reducing the output dynamics requirements of $A_3$. The needed AC decoupling, that is typically associated with the use of transformers and that excludes the error components in DC and at the lowest frequencies from the correction process, is obtained through the capacitor $C_6$, that along with $R_6$ determines the response at low frequencies of the circuit and that must be dimensioned in function of the needs of the specific application. The resistor $R_6$, having value as much high as possible in order not to excessively limit the gain at low frequencies but compatibly with acceptable values of the offset voltage produced by $R_6$ at the output because of the input bias currents of $OA_3$, creates a DC path between the output terminal and the input inverting terminal of $OA_3$, establishing a negative feedback loop around the error amplifier that effectively forces its output DC voltage to zero preventing high DC currents from flowing in the primary winding of $T_1$ compromising the dynamics and linearity thereof.

Figure 7C:
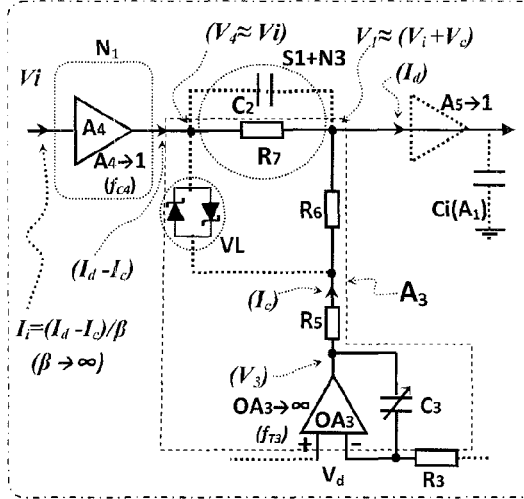

FIG. 7c shows the details of a second preferred implementation of the circuit scheme of the error correction portion of FIG. 7a, that is particularly appropriate for implementing correction loops of precision having wide band, DC included, and not too much high dynamics, such as for instance the correction loop of FIG. 2a and the second outer correction loop of FIG. 5. Since it is an unbalanced solution (single ended) (differently from the implementation of FIG. 7b), wherein the correction current is input with proper phase only at a terminal of the resistor $R_7$, that constitutes the central element of the adder and that here preferably assumes values ranging from tens to hundreds of Ohms, all the used active devices are of single-ended type and, hence, easily available on the market also in integrated form and at low costs. $R_7$ is separated upstream from the source $V_S$ of the input signal $V_i$ by means of the voltage follower $A_4$, that constitutes the block N1, and separated downstream from the amplifier $A_1$, subject to correction, by means of the further voltage follower $A_5$, that is inserted into the device, if necessary, in order to isolate $R_7$ from the input capacitance $C_i(A_1)$ of the amplifier $A_1$. Such separation is necessary in the case where the capacitance $C_i(A_1)$ is so much high that it can unacceptably reduce, with the parasitic pole $p_7 = 1/R_7 C_i(A_1)$ to which $R_7$ would otherwise give rise, not only the device passband but also the useful band of the error correction loop, thus reducing its effectiveness and compromising its stability. Such a situation occurs for instance when $A_1$ is constituted by a high power voltage follower using a plurality of MOSFETs in parallel, having very high input capacitance. In such case, the use of the block $A_5$ is not only necessary for the impedance separation, but it is also useful for driving the power stage. The requirements for $A_5$ include passband much larger than that of $A_1$, i.e. $f_C(A_5) \gg f_C(A_1)$, preferably $f_C(A_5) > 5 \cdot f_C(A_1)$, high dynamics of input and output voltage, high output current for driving the capacitance $C_i(A_1)$ and slew rate preferably equal to or larger than that of $A_1$.

The correction current $I_C$ necessary to produce the correction voltage $V_C$ across $R_7$ is obtained starting from the voltage $V_3$ at the output of the error operational amplifier $OA_3$ and through the resistors $R_5$ and $R_6$, which have a triple function: decoupling the low impedance output of $OA_3$ from $R_7$; contributing, along with $R_3$ and $C_3$, to the definition of $f_T(A_3)$ for optimizing the performance of the correction loop; and controlling the current dynamics of the error amplifier $A_3$, in this case constituted by the cascade of $OA_3$ with the resistive divider $R_5 + R_6 + R_7$ and having gain equal to $$A_3 = V_c/V_d = OA_3[R_7/(R_5+R_6+R_7)]$$

It should be noted that in the unbalanced implementation of FIG. 7c the correction current, equal to $I_C = (V_3 - V_i)/(R_5 + R_6 + R_7)$, passes through $R_7$ and is absorbed by the output of the voltage follower $A_4$, that has therefore to support, besides the normal and minor driving current $I_d$ of $A_1$, also the correction current $I_C$, that can be larger than the normal driving current also by one or more orders of magnitude, that contains both the useful signal fundamental and a lot of its harmonics. This implies burdensome requirements to $A_4$, in terms both of high linearity in the effective operative conditions and of low impedance and high output currents. These requirements add to those already discussed above which imply high linearity for not excessively deteriorating the voltage of signal $V_i$ and a very high bandwidth $f_C(A_4)$ such that $f_C(A_4) \gg f_C(A_1)$, preferably $f_C(A_4) > 5 f_C(A_1)$. It should be further noted that nowadays low cost integrated operational amplifiers are available with such performance that these requirements di $A_4$ are more than adequately satisfied in all the applications for which the solution of FIG. 7c is intended. However, in the most critical applications, as for instance in the case where $A_1$ is a high power voltage follower, it is possible that $A_4$ has to deal with, besides high currents $I_C$, also very high voltages at its input and output terminals, whereby the most simple use of an integrated operational amplifier can be inadequate and it will be necessary to make use of other solutions.

In order to quantify the typical correction current in actual applications of the circuit of FIG. 7c, in the following the realistic case is assumed wherein $R_7 = 100$ Ohm and a correction voltage $V_C \leq 200$ mV$_{(peak)}$, which correction voltage is typical in the cases where $A_1$ is an amplifier already with its overall negative feedback loop and it is thus operating in substantially linear regime with low error and it needs, therefore, minor corrections. In such conditions, it is $I_C \leq 2$ mA$_{(peak)}$, i.e. a value broadly within the reach of a good and inexpensive voltage follower, made through both operational amplifiers and discrete components, generally complementary bipolar transistors. Another parameter which must be taken into account when extremely low distortion values are pursued is the non-infinite current gain $\beta$ of $A_4$, that produces a current at the input of the device, equal to $I_i \approx (I_d - I_c)/\beta$, potentially high and even with minus sign, i.e. in anti-phase with respect to the voltage $V_i$ very full of harmonics and responsible for an error component $V_{ES} = -Z_S I_C/\beta$ produced across the impedance $Z_S$ of the signal source. The magnitude of $V_{ES}$ can be potentially important and, therefore, it is necessary to duly take account thereof while making the amplifier device using the implementation of FIG. 7c. The use of an operational amplifier with adequate characteristics for the implementation of $A_4$ generally solves this problem in a more than satisfactory way, although in very critical applications, wherein it is necessary to make use of discrete voltage followers with complementary bipolar transistors, the problem can require the use of other solutions, as those that will be described with reference to FIGS. 7d-7f.

In the case where the amplifier $A_1$ to correct is a power audio amplifier of 200 Watt at 4 Ohm already with its overall negative feedback loop, with gain $A_{10} = 32$ (30 dB), the signal at the input of the device, and hence at the inputs of $OA_3$, corresponding to the maximum of the output power, will be equal to Vi(max) = 1.25 V peak. Therefore, by assuming $R_7 = 100 \Omega$, $R_5 + R_6 = 3$ k$\Omega$ and Vc(max) = 100 mV, for the common mode input dynamics of $OA_3$ it is:

$$V_{CM} = [V(+) + V(-)]/2 = Vi < 1.25V$$

and for the voltage and current output dynamics:

$$V_{3(MAX)} = V_{i(MAX)} + V_{C(MAX)}(R_5 + R_6 + R_7)/R_7 = 4.35V$$

$$I_{3(MAX)} = I_{C(MAX)} = V_{C(MAX)}/R_7 = 1 \text{ mA}$$

Such input and output dynamics requirements of $OA_3$ are easily compatible with the dynamics obtainable from a good integrated operational amplifier available on the market, and supplied by a standard dual voltage ranging from +/−10V to +/−15V.

Finally, it should be observed that the implementation of FIG. 7c optionally also includes an original, simple and effective limiter of the correction voltage, constituted by a threshold limiter device VL of parallel ("shunt") type series connected between the output of $A_4$ and the node common to the two resistors R5 and R6 (the connections are indicated in dashed lines for pointing out that the device VL is optional). In FIG. 7c the device VL is represented by a pair of zener diodes anti-parallel connected to each other, i.e. with anode of one connected to the cathode of the other and vice versa. In such way, the maximum correction voltage will be equal to $V_{C(MAX)} = VL[R_7/(R_6 + R_7)]$ and it can be easily adjusted by varying the threshold voltage VL or the value of $R_6$. It should be noted that this simple limitation technique exclusively acts on the correction voltage and completely decouples the limitation mechanism from the absolute value of the passing voltage $V_i$ and from the absolute value of $V_3$ that is forced by the error correction loop to proportionally follow $V_i$ in its changes.

Figure 7D:
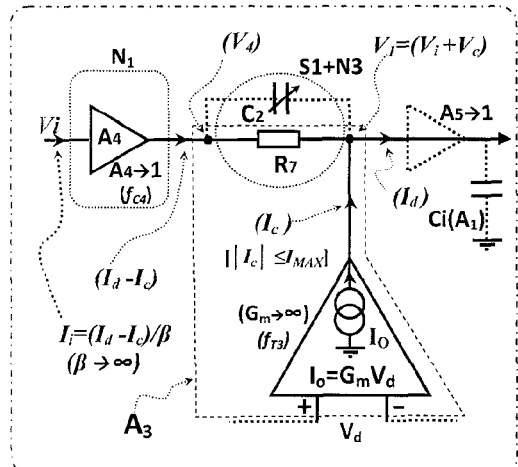

FIG. 7d shows the details of a third preferred implementation of the circuit scheme of the error correction portion of FIG. 7a, substantially similar to that of FIG. 7c, with the change of having the error amplifier $A_3$ made through an operational transconductance amplifier (OTA), provided with a high impedance unbalanced (single ended) output current, and having transfer function equal to $I_O = I_C = G_m V_d$, preferably very high values of $G_m$ and characteristics of precision, distortion, frequency response and speed (i.e. offset, CMRR, $f_T$, slew-rate, etc.) which are adequate to the application. In such scheme the error amplifier gain is equal to $A_3=V_c/V_d=G_mR_7$. The implementation of FIG. 7d is particularly appropriate for those applications wherein the limits of the dynamics of the useful signal Vi at the input of $A_1$ are very close to the supply voltages, $V_{A(+)}$ and $V_{A(-)}$, whereby the correction circuit has to be capable to correctly operate also in proximity to such voltages. An OTA is capable to best satisfy these requirements, since it can operate with sufficiently high and practically constant transconductance $G_m$ in a both input and output voltage range extending almost up to include the supply voltages, being spaced apart from them by not more than 2 Volts. Also, thanks to its high output impedance, in FIG. 7d the resistors for decoupling from $R_7$ are no more needed, whereby the high output dynamics of the OTA can be completely used.

Assuming the practical case where the amplifier $A_1$ that is desired to correct is the output MOSFET stage of a power audio amplifier, supplied with $V_{A(+)}=+70V$ and $V_{A(-)}=-70V$, and having input voltage $V_i$ included within the range $-65V<V_i<+65V$, and where the maximum correction voltage is equal to $V_{C(MAX)}=2V$ (including, besides the distortion components, also offset voltage and gain linear errors) and $R_7=50\Omega$, to which a current $I_C=V_{C(MAX)}/R_7=40$ mA$_{(MAX)}$ corresponds, the output dynamics of $A_3$ must be such that it is capable to provide the current of 40 mA in correspondence of the maximum output voltage equal to $|V_{3(max)}|+|Vi(max)|+Vc(max)|=67V$, and this is a requirement that a good OTA, made by using (also) discrete components and also supplied with $V_{A(+)}=+70V$ and $V_{A(-)}=-70V$, can effectively satisfy with a further margin of 1 Volt. The limitation of the current and correction voltage Ic and Vc can be easily carried out with an adequate and simple circuit limiting the output current inside the same OTA. A circuit implementing the OTA of FIG. 7d will be described later with reference to FIG. 8a.

In the cases where an OTA is used that is made of discrete components, generally complementary bipolar transistors, with typical gain $G_MR_7>40$ dB and with its own transition frequency $f_{T3}$ much larger than the optimal value of $f_T(A_3)$, it may be possible to use the capacitance of C2 with the double purpose of simply implementing the bypass network N3 and of reducing the transition frequency of the error amplifier so as to bring the ratio $R=f_T(A_3)/f_C(A_1N_2)$ of the correction loop to its optimal value. In fact, the parallel group $R^7//C_2$ in the error correction loop generates the pole $p_{30}=1/R_7C_2$ that, for proper values of $C_2$, becomes dominant and allows the most favorable conditions to the full use of the correction loop potential. In such conditions the transfer function of $A_3$ becomes equal to $V_3=Vc\approx G_{mo}R_7/(1+s/p_{30})$, where $G_{mo}$ is the value of the DC transconductance. Instead, along the path of the useful signal $V_i$, the same parallel group $R_7//C_2$ introduces the bypass zero $Z_{30}$ identically equal to $p_{30}$, beyond which the signal begins to bypass the adder reducing possible high frequency interferences with the correction loop, most of all due to high non-linearity phenomena, as limitations of slew-rate or saturation (clipping) phenomena at the output capable to generate dangerously high error voltages and temporary losses of balance of the device with associated phenomena of potential instability at high frequencies. In general, the corrected dimensioning of a limiter network VL (e.g. see FIG. 7a) is sufficient to limit such phenomena, but certainly the use of C2 improves the situation and ensures stability in all the operative conditions.

Figure 7E:
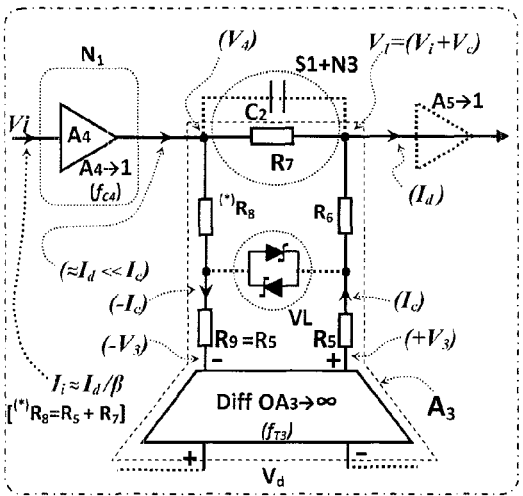

FIG. 7e shows the details of a fourth preferred implementation of the circuit scheme of the error correction portion of FIG. 7a, that is practically a development of that described in FIG. 7c, with respect to which it differs in that the generation of the correction voltage $V_C$ occurs in balanced form, through an error voltage amplifier $A_3$ (also indicated with the reference DiffOA3 in FIG. 7e) having two outputs in phase opposition, thus capable to input the correction current $+I_C=V_C/R_7$ to a terminal of $R_7$ with positive phase and to reabsorb it with identically equal value but in anti-phase, $-I_C=V_C/R_7$, from the other terminal of $R_7$. The advantage with respect to the implementation of FIG. 7c is that of eliminating the current $I_C$ from the signal path and easing the requirements of $A_4$ in terms both of current and output impedance and of current gain β, that is particularly useful in the case where it is appropriate or necessary to use for $A_4$ an open-loop voltage follower made through discrete components, in particular with complementary bipolar transistors (which have, with respect to the solutions using integrated operational amplifiers, much higher supply voltages, frequency bands and dynamics, but much lower current gains β). In this way, the component of input current $I_i(I_C)$ depending on the correction current, that in the implementation of FIG. 7e tends to zero, is at least strongly reduced if not completely eliminated. It should be also noted that the optional correction voltage limiter VL (similar to that of FIG. 7c) is located between two voltages proportional to $V_C$ but in anti-phase, whereby $V_{C(MAX)}=VL[R_7/2(R_6+R_7)]$. All the other considerations made with reference to the implementation of FIG. 7c remain valid also for the implementation of FIG. 7e.

It should be noted that the zener diodes shown in FIGS. 7c and 7e can be replaced with any voltage limiter bipolar device with functions equivalent to those of a zener diode, whereby it offers a very high impedance for voltage differences between the two terminals lower than a threshold value and a very low impedance for voltage differences between the two terminals larger than the threshold value. By way of example, for a threshold value having proper value (e.g. equal to 0.6 Volt) the zener diodes can be replaced by simple diodes. In the claims, such devices (including the same zener diodes) are defined as zener-equivalent bipolar devices.

Figure 7F:
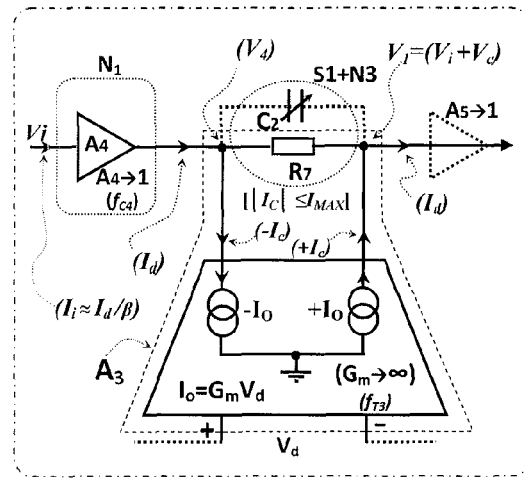

FIG. 7f shows the details of a fifth preferred implementation of the circuit scheme of the error correction portion of FIG. 7a, that is practically a development of that shown in FIG. 7d, with respect to which it differs in that the generation of the correction voltage occurs in balanced form, through an error amplifier $A_3$ still of OTA type with current output, but provided with two outputs operating in anti-phase. The advantages of the mechanism of balanced driving of R7 for obtaining the voltage Vc are exactly the same of those described in relation to FIG. 7e. The advantages of the use of an error amplifier of OTA type are exactly the same described in relation to FIG. 7d, and in particular the considerations made with reference to the bypass mechanism through $C_2$, the larger output dynamics of the solutions based on OTA, and the possibility to establish a maximum of the correction voltage with a corresponding control of the limitation of current at the output of $A_3$ continue to be valid. Two circuits which are capable to implement the OTA of FIG. 7f will be described later with reference to FIGS. 8b and 8c.

Figure 8A:
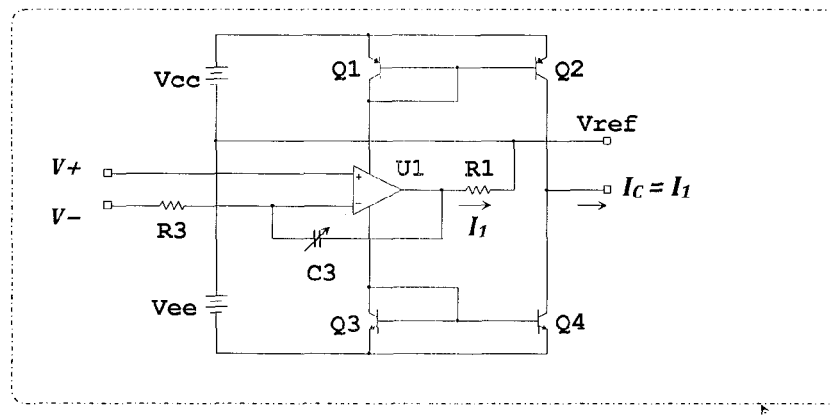
FIG. 8 shows the circuit diagrams of particular components of FIG. 7.

FIG. 8a shows a circuit diagram capable to implement the OTA $A_3$ of FIG. 7d, having a very high transconductance ($g_{ma}\to\infty$), an unbalanced output and a high output dynamics in both voltage and current. The input voltage $V_d=[(V+)-(V-)]$ is amplified by $A_{U1}$ times by the operational amplifier U1 and it produces a current at the output of U1 equal to $I_1=A_{U1}V_d/R_1$. Such current produces an equal variation in the supply currents of U1 that is replicated by the two complementary current mirror circuits (transistors pnp Q1Q2 and npn Q3Q4) through which U1 is supplied. Therefore $I_C=I_1=A_{U1}V_d/R_1$, and the circuit equivalent transconductance is equal to $g_{ma}=A_{U1}/R_1$. The unity gain frequency $f_T(A_3)$ can be controlled with a proper dimensioning of the capacitor $C_3$, as shown in FIG. 8a by way of pure example and not by way of limitation. The two circuit supply voltages, Vcc and Vee, can be referred to ground (in this case Vref=0 V) or, in the cases where it is necessary a larger voltage dynamics in input and/or in output, they can be referred to a proper node N of the device (with a direct short-circuit connection if it is a low impedance node or through a voltage follower for decoupling its impedance) and in this case Vref=$V_N$.

Figure 8B:
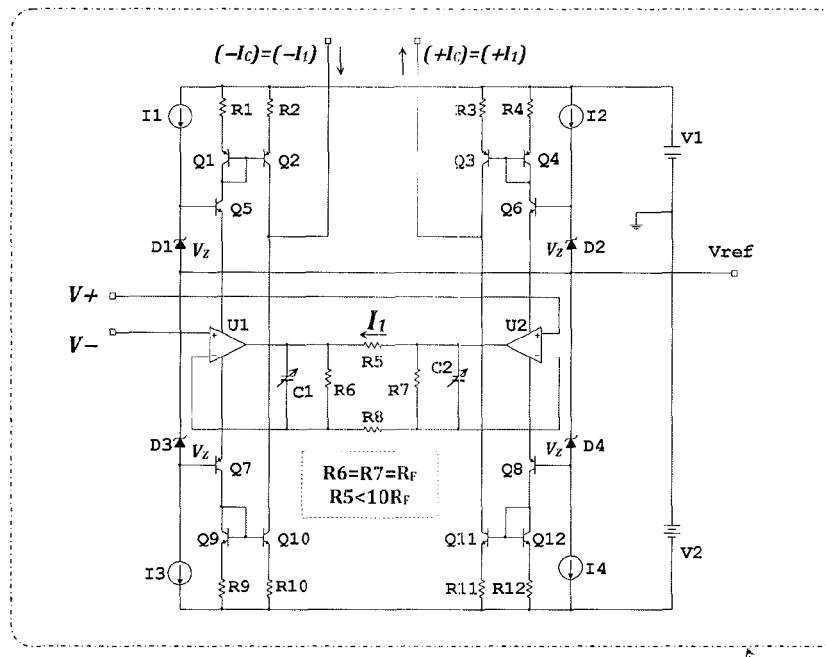

FIG. 8b shows a first circuit diagram capable to implement the OTA $A_3$ of FIG. 7f, having a high transconductance ($g_{mb}$>100), a balanced output and a high output dynamics in both voltage and current. The circuit uses two operational amplifiers U1 and U2 connected to form a difference amplifier, the voltage gain of which, controlled by a negative feedback loop, is equal to $A_{DA} \approx 2R_F/R_8$ and it may be very high (>1000) at low frequencies. The input voltage $V_d=[(V+)-(V-)]$ is therefore amplified by a factor $A_{DA}$ and produces a current across $R_5$ equal to $I_1=A_{DF}V_d/R_5$. A mechanism of measuring and replicating the supply current, similar to the one used for the OTA of FIG. 8a, allows to obtain at the output, through the use of two pairs of complementary current mirror circuits ($Q_1Q_2$&$Q_9Q_{10}$ and $Q_3Q_4$&$Q_{11}Q_{12}$) and thanks to the perfect integral symmetry of the circuit, two currents, respectively (+$I_C$) and (−$I_C$), perfectly equal in amplitude and in perfect phase opposition at all the frequencies, the value of which is nominally equal to $I_1$. Therefore the equivalent transconductance of the circuit is equal to $g_{mb}=A_{DF}/R_5=2R_F/R_5R_8$. Also in this case, the unity gain frequency $f_T(A_3)$ can be controlled with a proper dimensioning of the two capacitors $C_1$ and $C_2$, as shown in FIG. 8b by way of pure example and not by way of limitation. The two operational amplifiers U1 and U2 are supplied by two series voltages Vz, potentially floating, derivated from the higher primary supply (V1 and V2 which normally also supply the amplifier $A_1$ to correct) through the circuit constituted by the current generators I1, I2, I3 and I4, by the zener diodes D1, D2, D3 and D4, and finally by the transistors Q5, Q6, Q7 and Q8. The purpose of such four transistors is to allow the flow of the supply currents of U1 and U2, and hence of $I_1$, to the related current mirror circuits. In the case where a high dynamic in input/output of $A_3$ is necessary, the reference central voltage Vref can be connected, as in the case of the OTA of FIG. 8a, to a proper voltage of the device. In the case where $A_1 \approx 1$ (i.e. $A_1$ is a voltage follower), Vref can be conveniently connected to the output voltage of $A_1$ or of its driving circuit (driver).

Figure 8C:
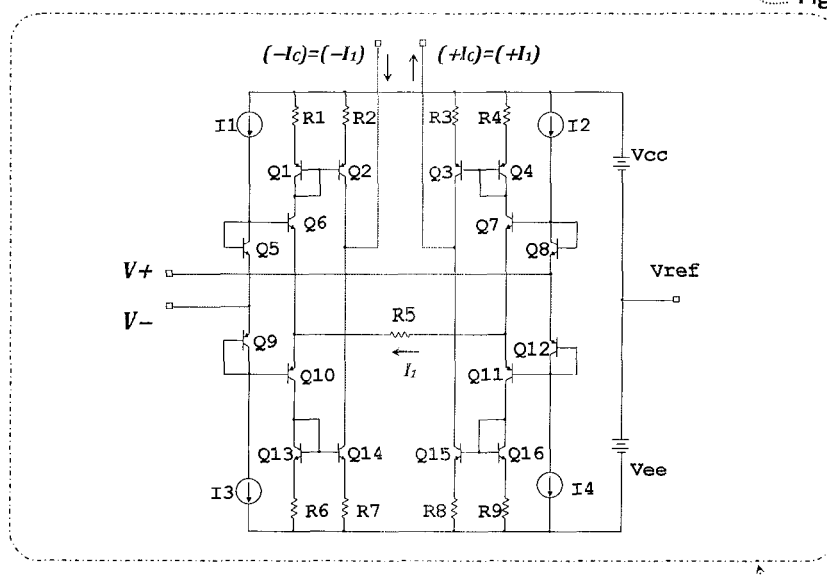

FIG. 8c shows a second circuit diagram capable to implement the OTA $A_3$ of FIG. 7f, having a modest DC transconductance ($g_{mco}$<1), but with an intrinsically very wide bandwidth (i.e. with $C_2$=0), i.e. with $f_T(A_3) \gg f_C(A_1)$, preferably $f_T(A_3)|_{(C2=0)} > 5 \cdot f_C(A_1)$, a balanced output (precisely two push-pull outputs in anti-phase), a high output current, thanks to the capability of its single stages to operate in class-AB, and a very high voltage dynamics in both input and output. The circuit does not use operational amplifiers but only complementary transistors (npn and pnp) so as to be capable to operate at very high voltage, if necessary, and, thanks to its topology containing only two stages with very large gain bandwidth in cascade, to offer an intrinsically very wide bandwidth and hence a very high unity gain frequency $f_T(A_3)|_{(C2=0)}$, preferably larger than $5 \cdot f_C(A_1)$. In particular, the circuit of FIG. 8c exploits its simple integral symmetry structure. In fact, (as in the case of the circuit of FIG. 8b) the circuit of FIG. 8c is symmetrical both with respect to the positive/negative signal polarity, that characterizes the push-pull circuits with complementary symmetry in class-AB (that visually translates in FIG. 8c into the complementary specularity of the upper half with respect to the lower one), and with respect to the two input signals (V+) and (V−) and to the two output signals (+Ic) and (−Ic) (that visually translates in FIG. 8c into the perfect specularity of the right part with respect to the left one). Although it has limited gain and precision, the circuit of FIG. 8c can be optimized for operating at high voltage and for offering optimal performance in terms of dynamics, intrinsic bandwidth, common mode rejection at high frequencies in both input and output. This renders the circuit of FIG. 8c particularly appropriate for the local correction loop of unity gain power stages ($A_1 \rightarrow 1$), in both discrete and monolithic circuits, as in the applications of the device according to the invention shown in FIGS. 3 and 5.

The transistors Q5, Q6, Q9 and Q10 form a first class-AB push-pull voltage follower operating as interface of (V−), whereas the transistors Q7, Q8, Q11 and Q12 form a second class-AB push-pull voltage follower operating as interface of (V+). Hence, the voltage Vd virtually appear unaltered across $R_5$ for developing the current $I_1=V_d/R_5$, that passes with reversed phases through the two voltage followers: the positive current $I_d$ passes through the transistors Q7-Q10, the negative current $I_d$ passes through the transistors Q6-Q11. The current mirror pnp and npn circuits (respectively, Q1-Q2/Q3-Q4 and Q13-Q14/Q15-Q16, similar to those shown in FIG. 8b), preferably but not necessarily with unity current gain, i.e. $I_C=I_1$, and coupled so as to also operate in class-AB push-pull, measure and replicate such currents, rendering them available at the two output terminals with high internal impedance, and with wide both voltage and current dynamics. Consequently, the DC transconductance of the circuit is equal to $g_{mco}=1/R_5$. Given its simplicity and the few stages constituting it, the circuit of FIG. 8c typically has an extended frequency response dominated by one single pole $p_{mc}$, with $f_{mc}=p_{mc}/2\pi$ that is very close to $f_T(A_3)|_{(C2=0)}$, and equal to $$g_{mc}=(1/R_5)/(1+s/p_{mc}) \tag{17}$$

Since the correction voltage $V_C$ developed in the scheme of FIG. 7f across the impedance $Z_7$, constituted by the parallel $R_7//C_2$, is equal to $V_C=I_1Z_7=V_dZ_7/R_5$, where $Z_7=R_7/(1+s/p_{30})$, wherein $p_{30}=1/C_2R_7$, the overall voltage gain of the error amplifier of FIG. 8c has two poles and is given by $$A_3=V_C/V_d=g_{mc}Z_7=(R_7/R_5)/[(1+s/p_{30})(1+S/p_{mc})] \tag{18}$$

Since, as stated, $f_T(A_3)$ can never be, for stability reasons, larger than $f_C(A_1)$, and $f_{mc}$ is very close to $f_T(A_3)|_{(C2=0)} > 5 \cdot f_C(A_1)$, it follows that the frequency $f_{mc}$ is much beyond both $f_C(A_1)$ and $f_T(A_3)$. The pole $p_{mc}$ is always much beyond $2\pi f_T(A_3)$ and it may be neglected in equation (18), that may be consequently simplified in the form $$A_3=g_{mc}Z_7 \approx (R_7/R_5)/(1+s/p_{30}) \tag{19}$$

This implies that the frequency response of the OTA $A_3$ of FIG. 8c is dominated by the pole $p_{30}$ introduced by the correction impedance $Z_7$, that hence can also operate, through $C_2$, as simple means for adjusting the unity gain frequency $f_T(A_3)=(R_7 \ p_{30})/(2\pi R_5)$ for controlling the frequency response of the correction loop and hence its stability. Therefore, $C_2$ simultaneously performs, in a particularly effective way thanks to the circuit simplicity, both the function of stabilizing the correction loop, and the function of bypassing the correction mechanism at highest frequencies by introducing the zero $z_{30} \equiv p_{30}$ along the main path of the useful signal (in order to avoid the potential problems of correction loop instability).

The specific implementations of the operational transconductance amplifiers shown in FIGS. 8a, 8b and 8c can be also used in apparatuses different from the amplifier device according to the invention.

Figure 9:
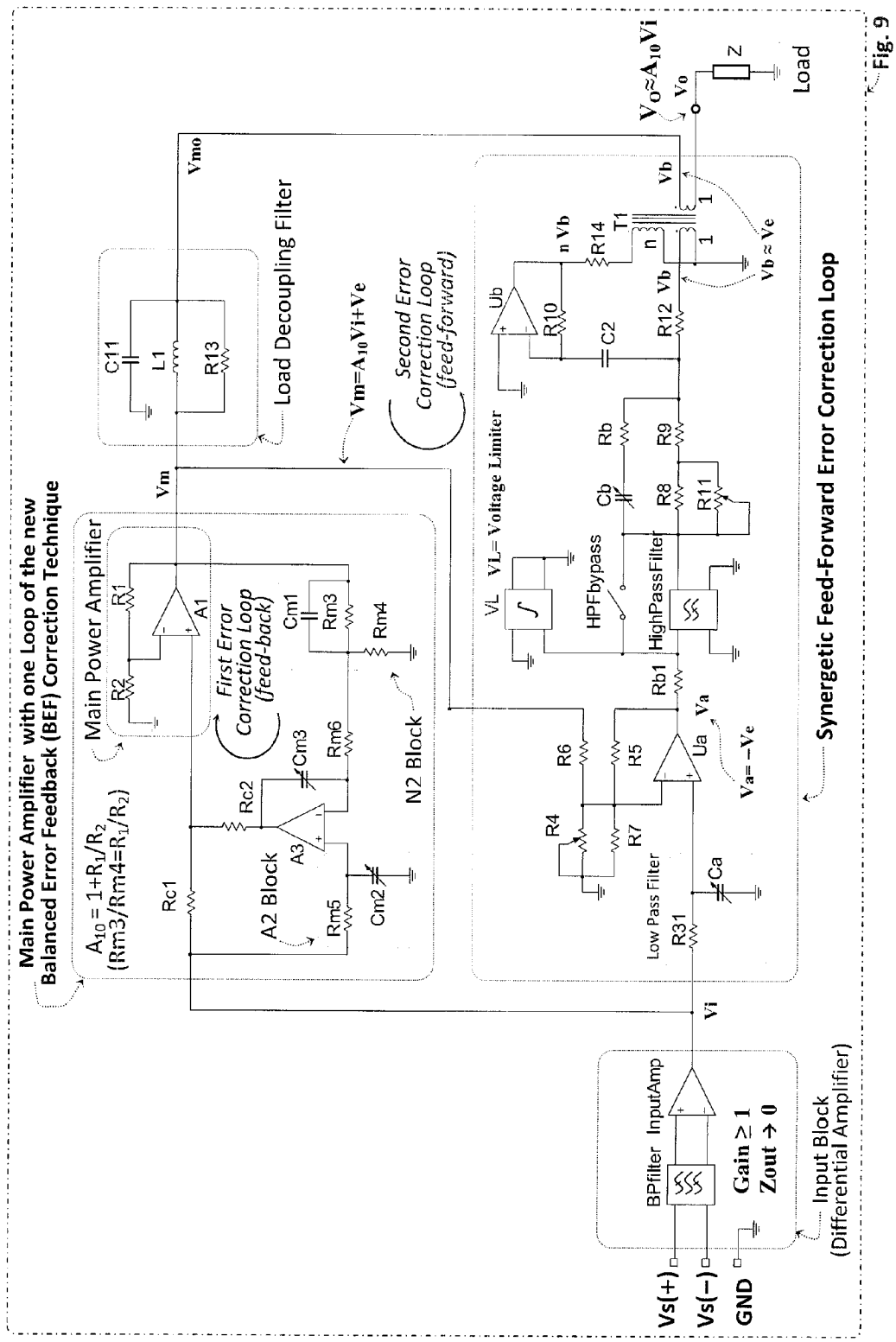
FIG. 9 shows a circuit diagram of a fourth embodiment of the amplifier device according to the invention.

FIG. 9 shows a circuit diagram of a fourth embodiment of the amplifier device according to the invention that synergically uses the technique of negative feedback error correction (Feed-Back) on which the present invention is based with the technique of feed-forward correction (Feed-Forward) described, for instance, in the U.S. Pat. No. 7,564,304. Such synergic use permits to make power amplifiers, particularly but not exclusively for the audio field, capable to combine high dynamic performance (architectural simplicity, high slew-rate, wide band, etc.), necessary to ensure an optimal electrical and sound transparency, very high precision levels (low noise, low offset voltage and low drift) with extremely low values of overall distortion (including all the signal harmonics up to more than 100 kHz) in the whole audio frequency range and at all the power levels, potentially even lower than $THD_{MAX}$=0.00001%.

In the device of FIG. 9, two further error correction loops, both essentially not interfering with the main path of the useful signal, are synergically applied to the power amplifier A1 to correct, already provided with its own negative feedback loop constituted by the resistors R1 and R2 that defines its time-frequency response: a first balanced negative feedback error correction loop, outside A1, operating as in the scheme of FIG. 2a; a second feed-forward correction loop, outside the two preceding negative feedback loops applied to A1 and that is similar to that, for instance, of the U.S. Pat. No. 7,564,304.

The most important results from a design and industrial point of view which can be conveniently obtained with such combination are essentially as follows:
  the possibility to use for A1 a circuit architecture capable to maximize its dynamic and sound performance by employing for instance configurations of "Current Feedback" type, which as it is known usually have higher values of distortion (typically THD≤0.05%), noise, offset voltage and bias and offset currents, and related drifts;
  the possibility to employ the first balanced negative feedback error correction loop of FIG. 9 for a first significant reduction of the nonlinear distortion (down to values of THD≤0.002%), and most of all for substantially reducing both bias/offset voltage and current of A1 and the noise and the drift at low-frequency, in order to ease the task of the second feed forward correction loop with coupling output transformer, that just at low frequencies has intrinsically more limited correction dynamics and performance;
  the possibility to best exploit the potentialities of the feed forward correction loop for cancelling the harmonic and intermodulation distortion in the whole audio frequency band according to the modes of the feed-forward correction technique described, for instance, in the U.S. Pat. No. 7,564,304, obtaining very low distortion values at the output thanks to the synergic operation of the two correction loops (typically THD≤0.00002%).

The preferred embodiments have been above described and some modifications of this invention have been suggested, but it should be understood that those skilled in the art can make variations and changes, without so departing from the related scope of protection.

The invention claimed is:

1. Amplifier device, capable to receive at an input an input signal and to provide at least one output amplified signal to a load connected to at least one output terminal of the device, the device comprising at least one amplifier electronic block, having a transfer function A1 between at least one input and at least one output, said at least one output of said at least one amplifier electronic block being connected to said at least one output terminal of the device, at least one input of said at least one amplifier electronic block being connected to an output of a respective adder adding two input signals, a first input of the adder being connected to an output of a respective support electronic block, having a transfer function N1 between an input and the output, an input of the support electronic being connected to the input of the device, a second input of the adder being connected to an output of a respective error amplifier, the error amplifier having a non-inverting input and an inverting input and having a transfer function A3 between a difference of signals present at the non-inverting and inverting inputs and the output, a first input of the error amplifier selected from the non-inverting and inverting inputs being connected to an output of a respective attenuator electronic block, having a transfer function N2 between an input and the output, the input of the attenuator electronic block being connected to at least one output of said at least one amplifier electronic block, wherein the device further comprises a balancing electronic block, having a transfer function A2 between an input, that is connected to the input of the device, and an output, a second input of the error amplifier selected from the non-inverting and inverting inputs being connected to the output of the balancing electronic block, the transfer function A2 being equal to the product A1N1N2, with the second input of the error amplifier that is different from the first one.

2. Device according to claim 1, wherein said at least one amplifier electronic block is selected from a voltage amplifier block and a current amplifier block, said at least one input of said at least one amplifier electronic block being of either unbalanced or balanced type, said at least one output of said at least one amplifier electronic block being of either unbalanced or balanced type, said at least one amplifier electronic block being either non-inverting or inverting.

3. Device according to claim 1, wherein it further comprises a voltage limiter electronic block capable to limit a voltage at the second input of the adder produced by the output of the error amplifier, wherein the second input of the adder is galvanically isolated from the first input and from the output of the adder, the voltage limiter electronic block having at least one first terminal connected to the output of the error amplifier, the voltage limiter electronic block having at least one second terminal connected to a circuit ground.

4. Device according to claim 1, wherein it further comprises a voltage limiter electronic block capable to limit a voltage at the second input of the adder produced by the output of the error amplifier, wherein the second input of the adder is not galvanically isolated from the first input and/or from the output of the adder, the voltage limiter electronic block having at least one first terminal connected to the output of the error amplifier, the voltage limiter electronic block having at least one second terminal connected to the first input of the adder.

5. Device according to claim 1, wherein it further comprises a bypass electronic block, having a voltage transfer function N3 between an input and an output, the input and the output of the bypass electronic block being respectively connected to the output of the support electronic block and to the output of the adder, the transfer function N3 being capable to make voltage signal components having frequency higher than a threshold value fCB present at the output of the support electronic block pass through the bypass electronic block, whereby for frequencies higher than fCB the output of the bypass electronic block is predominant over the output of the adder.

6. Device according to claim 1, wherein the transfer function N2 of the attenuator electronic block is such to introduce a phase lead in the cascade formed by said at least one amplifier electronic block and by the respective attenuator electronic block for increasing the unity gain frequency fT(A3) of the amplifier electronic block.

7. Device according to claim 1, wherein the balancing electronic block controls, in amplitude and/or in phase, the low-frequency response of the device by introducing an equalisation ϵ(f) of amplitude and/or of phase.

8. Device according to claim 1, wherein:
said first input of the error amplifier is inverting and said second input of the error amplifier is non-inverting,
said at least one amplifier electronic block comprises a non-inverting amplifier having a positive DC nominal gain A10 larger than 1 and having a cutoff frequency equal to fC1, the transfer function A1 being a low-pass transfer function,
the support electronic block comprises a first voltage follower having nominal unity transfer function A4 and having cutoff frequency equal to fC4,
the attenuator electronic block comprises a first resistor network having attenuation ratio equal to 1/A10.

9. Device according to claim 8, wherein:
the support electronic block is a direct short-circuit connection whereby N1≡1, and
the balancing electronic block is a passive low-pass filter having one single pole and comprising a RC network that includes a variable capacitor for obtaining an AC balancing.

10. Device according to claim 1, wherein:
said first input of the error amplifier is inverting and said second input of the error amplifier is non-inverting,
said at least one amplifier electronic block comprises an amplifier having a non-inverting lurality of stages, whereby such amplifier is a non-inverting amplifier, wherein said non-inverting amplifier is a negative feedback amplifier through a second resistor network, having a positive DC nominal gain A10 larger than 1 and having a cutoff frequency equal to fC1, the transfer function A1 being a low-pass transfer function of first order or second order, with damping coefficient ζ larger than 0.8, i.e. ζ>0.8,
the support electronic block comprises a first voltage follower having nominal unity transfer function A4 and having cutoff frequency equal to fC4, where fC4>5·fC1,
the attenuator electronic block comprises a first resistor network, comprising at least one variable resistor for obtaining an AC balancing, having attenuation ratio equal to 1/A10,
the balancing electronic block is a passive low-pass filter, having not more than two poles and comprising a RLC network having one single pole,
the attenuator electronic block further comprising a variable capacitor connected in parallel with a resistor of the first resistor network.

11. Device according to claim 1, wherein:
said first input of the error amplifier is inverting and said second input of the error amplifier is non-inverting,
said at least one amplifier electronic block comprises a non-inverting amplifier, that is a negative feedback one with a feedback resistor network, having a positive DC nominal gain A10 larger than 1, and having a cutoff frequency equal to fC1, the transfer function A1 being a low-pass transfer function,
the support electronic block comprises a first voltage follower having nominal unity transfer function A4 and having cutoff frequency equal to fC4,
the attenuator electronic block comprises the feedback resistor network of the negative feedback of the non-inverting amplifier of said least one amplifier electronic block and having attenuation ratio equal to 1/A10.

12. Device according to claim 11, wherein:
the support electronic block is a direct short-circuit connection whereby N1≡1, and
the balancing electronic block is a passive low-pass filter having one single pole and comprising a RC network that includes a variable capacitor.

13. Device according to claim 1, wherein:
said first input of the error amplifier is inverting and said second input of the error amplifier is non-inverting,
said at least one amplifier electronic block comprises a non-inverting amplifier having a plurality of stages, that is a negative feedback amplifier with a feedback resistor network, having a positive DC nominal gain A10 larger than 1, and having a cutoff frequency equal to fC1, the transfer function A1 being a low-pass transfer function of first order or second order, with damping coefficient ζ larger than 0.8, i.e. ζ>0.8,
the support electronic block comprises a first voltage follower having nominal unity transfer function A4 and having cutoff frequency equal to fC4, where fC4>5·fC1,
the attenuator electronic block comprises the feedback resistor network of the negative feedback of the non-inverting amplifier of said least one amplifier electronic block and having attenuation ratio equal to 1/A10,
the balancing electronic block is a passive low-pass filter, having not more than two poles and comprising a RLC network.

14. Device according to claim 1, wherein:
said first input of the error amplifier is non-inverting and said second input of the error amplifier is inverting,
said at least one amplifier electronic block comprises a non-inverting amplifier, having a positive DC nominal gain A10 larger than 1, and having a cutoff frequency equal to fC1, the transfer function A1 being a low-pass transfer function,
the support electronic block comprises a first voltage follower having nominal unity transfer function A4 and having cutoff frequency equal to fC4,
the attenuator electronic block comprises a first resistor network, having attenuation ratio equal to 1/A10,
the adder is made through an inverting input of said at least one amplifier electronic block that is connected to the output of the error amplifier.

15. Device according to claim 14, wherein:
the support electronic block is a direct short-circuit connection whereby N1≡1,
the balancing electronic block is a passive low-pass filter having one single pole and comprising a RC network that includes a variable capacitor.

16. Device according to claim 1, wherein:
said first input of the error amplifier is non-inverting and said second input of the error amplifier is inverting,
said at least one amplifier electronic block comprises a non-inverting amplifier having a non-inverting plurality of stages, said non-inverting amplifier being a negative feedback one with a second resistor network, having a positive DC nominal gain A10 larger than 1, and having a cutoff frequency equal to fC1, the transfer function A1 being a low-pass transfer function of first order or second order, with damping coefficient ζ larger than 0.8, i.e. ζ>0.8, the support electronic block comprises a first voltage follower having nominal unity transfer function A4 and having cutoff frequency equal to fC4, where fC4>5·fC1, the attenuator electronic block comprises a first resistor network comprising at least one variable resistor, having attenuation ratio equal to 1/A10, the attenuator electronic block further comprising a variable capacitor connected in parallel to a resistor of the first resistor network, the adder is made through an inverting input of said at least one amplifier electronic block that is connected, through a resistor, to the output of the error amplifier, the balancing electronic block is a passive low-pass filter having not more than two poles and comprising a RLC network.

17. Device according to claim 1, wherein:

said at least one amplifier electronic block comprises a power voltage follower, having a positive DC nominal gain A10 ranging from 0 to 1.5 and having a cutoff frequency equal to fC1, the support electronic block comprises a first voltage follower having nominal unity transfer function A4 and having cutoff frequency equal to fC4, the attenuator electronic block is a direct short-circuit connection whereby N2≡1.

18. Device according to claim 17, wherein:

said at least one amplifier electronic block comprises an open-loop power voltage follower, made through bipolar and/or MOSFET devices belonging to an integrated circuit, having either one or two poles, the support electronic block is a direct short-circuit connection whereby N1≡1, the balancing electronic block is a passive low-pass filter having one single pole and comprising a RC network, that includes a resistor connected in parallel to a capacitor, the DC gain A20 of the balancing electronic block being equal to A10.

19. Device according to claim 1, wherein:

said at least one amplifier electronic block comprises an open-loop power voltage follower, made through bipolar and/or MOSFET devices, having a positive DC nominal gain A10 ranging from 0 to 1.5 and having a cutoff frequency equal to fC1, and having either one or two poles, the support electronic block comprises a first voltage follower having nominal unity transfer function A4 and having cutoff frequency equal to fC4, where fC4>5·fC1, the attenuator electronic block is a direct short-circuit connection whereby N2≡1, the balancing electronic block is a passive low-pass filter having not more than two poles and comprising a RLC network, the DC gain A20 of the balancing electronic block being equal to A10.

20. Device according to claim 1, wherein the device comprises a plurality of two or more amplifier electronic blocks all equal to each other, having a cutoff frequency equal to fC1, the outputs of which are connected to the inputs of respective second attenuator electronic blocks the outputs of which are connected to the inverting inputs of respective error amplifiers, the non-inverting inputs of all the error amplifiers being connected to one single balancing electronic block.

21. Device according to claim 20, wherein the balancing electronic block is a passive low-pass filter having not more than two poles.

22. Device according to claim 20, wherein the balancing electronic block is an amplifier unit comprising an electronic block equal to the amplifier electronic blocks of the plurality.

23. Device according to claim 1, wherein:

said at least one amplifier electronic block has a cutoff frequency equal to fC1, the support electronic block comprises a first voltage follower having cutoff frequency equal to fC4, and wherein the adder comprises a first resistor having a first terminal connected to the output of the support electronic block and a second terminal connected to the output of the error amplifier through a galvanically isolated connection, wherein the first and second terminals of the first resistor are connected to a secondary winding of a transformer having a turns ratio n, for forming a loop, whereby the current of the secondary winding of the transformer is forced to exclusively flow through the first resistor, a primary winding of the transformer being connected to the output of the error amplifier, the inverting input of which is connected to the output of the attenuator electronic block through a RC network, capable to force a DC voltage at the output of the error amplifier to be equal to zero.

24. Device according to claim 23, wherein the primary winding of the transformer is connected through a second resistor to the output of the error amplifier, said RC network, capable to force a DC voltage at the output of the error amplifier to be equal to zero comprising at least one variable capacitor and/or at least one variable resistor for adjusting the unity gain frequency fT(A3) of the error amplifier depending on the turns ratio n, the transformer having a ferrite core.

25. Device according to claim 1, wherein:

said at least one amplifier electronic block has a cutoff frequency equal to fC1, the support electronic block comprises a first voltage follower having cutoff frequency equal to fC4, and wherein the adder comprises a first resistor having a first terminal connected to the output of the support electronic block and a second terminal connected to the output of the error amplifier through an unbalanced voltage connection through a resistive branch connecting a first terminal of the first resistor at the output of the error amplifier.

26. Device according to claim 25, wherein the first terminal of the first resistor at the output of the error amplifier is connected to the input of said at least one amplifier electronic block through a second voltage follower having cutoff frequency equal to fC5, where fC5>5·fC1, and wherein said RC network comprises at least one variable capacitor and/or at least one variable resistor for adjusting the unity gain frequency fT(A3) of the error amplifier.

27. Device according to claim 1, wherein:

said at least one amplifier electronic block has a cutoff frequency equal to fC1, the support electronic block comprises a first voltage follower having cutoff frequency equal to fC4, and wherein the adder comprises a first resistor having a first terminal connected to the output of the support electronic block and a second terminal connected to the output of the error amplifier through an unbalanced current direct short-circuit connection, wherein a first terminal of said first resistor is connected to the output of the error amplifier that is made through a transconductance operational amplifier having unbalanced current output constituting the output of the error amplifier.

28. Device according to claim 1, wherein:

said at least one amplifier electronic block has a cutoff frequency equal to fC1, the support electronic block comprises a first voltage follower having cutoff frequency equal to fC4, and wherein the adder comprises a first resistor having a first terminal connected to the output of the support electronic block and a second terminal connected to the output of the error amplifier through a balanced voltage connection through two resistive branches which connect the terminals of the first resistor at the output of the error amplifier that is a balanced voltage output.

29. Device according to claim 1, wherein:

said at least one amplifier electronic block has a cutoff frequency equal to fC1, the support electronic block comprises a first voltage follower having cutoff frequency equal to fC4, and wherein the adder comprises a first resistor having a first terminal connected to the output of the support electronic block and a second terminal connected to the output of the error amplifier through a balanced current direct short-circuit connection, wherein the terminals of the first resistor are connected to the output of the error amplifier that is made through a transconductance operational amplifier having balanced current output.

30. Device according to claim 1, characterised in that said at least one amplifier electronic block comprises in turn an internal loop amplifier device, capable to receive at an input an input signal and to provide at least one output amplified signal to a load connected to at least one output terminal of the internal loop amplifier device, the internal loop amplifier device comprising at least one amplifier electronic block, having a transfer function A1 between at least one input and at least one output, said at least one output of said at least one amplifier electronic block being connected to said at least one output terminal of the internal loop amplifier device, at least one input of said at least one amplifier electronic block being connected to an output of a respective adder adding two input signals, a first input of the adder being connected to an output of a respective support electronic block, having a transfer function N1 between an input and the output, an input of the support electronic block being connected to the input of the internal loop amplifier device, a second input of the adder being connected to an output of a respective error amplifier, the error amplifier having a non-inverting input and an inverting input and having a transfer function A3 between a difference of signals present at the non-inverting and inverting inputs and the output, a first input of the error amplifier selected from the non-inverting and inverting inputs being connected to an output of a respective attenuator electronic block, having a transfer function N2 between an input and the output, the input of the attenuator electronic block being connected to at least one output of said at least one amplifier electronic block, wherein the internal loop amplifier device further comprises a balancing electronic block, having a transfer function A2 between an input, that is connected to the input of the internal loop amplifier device, and an output, a second input of the error amplifier selected from the non-inverting and inverting inputs being connected to the output of the balancing electronic block, the transfer function A2 being equal to the product A1N1N2, with the second input of the error amplifier that is different from the first one.

* * * * *